(12) United States Patent
Won et al.

(10) Patent No.: US 11,622,181 B2
(45) Date of Patent: Apr. 4, 2023

(54) DISPLAY DEVICE

(71) Applicant: Samsung Display Co., LTD., Yongin-si (KR)

(72) Inventors: Byeong Hee Won, Incheon (KR); Joon Hak Oh, Seongnam-si (KR)

(73) Assignee: SAMSUNG DISPLAY CO., LTD., Gyeonggi-Do (KR)

( * ) Notice: Subject to any disclaimer, the term of this patent is extended or adjusted under 35 U.S.C. 154(b) by 495 days.

(21) Appl. No.: 16/695,132

(22) Filed: Nov. 25, 2019

(65) Prior Publication Data

US 2020/0252707 A1 Aug. 6, 2020

(30) Foreign Application Priority Data

Feb. 1, 2019 (KR) .................. 10-2019-0013991

(51) Int. Cl.
| | |
|---|---|
| *H04R 1/02* | (2006.01) |
| *H04R 9/06* | (2006.01) |
| *H04R 9/02* | (2006.01) |
| *H04R 9/04* | (2006.01) |
| *H04R 7/04* | (2006.01) |
| *H01L 27/32* | (2006.01) |
| *H01L 51/52* | (2006.01) |
| *H01L 25/18* | (2023.01) |
| *H01L 41/09* | (2006.01) |
| *H01L 51/56* | (2006.01) |

(52) U.S. Cl.
CPC ............ *H04R 1/028* (2013.01); *H01L 25/18* (2013.01); *H01L 27/3225* (2013.01); *H01L 27/3276* (2013.01); *H01L 41/09* (2013.01); *H01L 51/529* (2013.01); *H01L 51/5246* (2013.01); *H01L 51/5253* (2013.01); *H01L 51/56* (2013.01); *H04R 7/04* (2013.01); *H04R 9/025* (2013.01); *H04R 9/045* (2013.01); *H04R 9/06* (2013.01); *H04R 2499/15* (2013.01)

(58) Field of Classification Search
CPC ....................................................... H04R 1/02
See application file for complete search history.

(56) References Cited

U.S. PATENT DOCUMENTS

| | | | | |
|---|---|---|---|---|
| 9,565,489 B2* | 2/2017 | Lee | ............ | H04R 1/028 |
| 11,166,108 B2* | 11/2021 | Kim | ............ | H04R 7/045 |
| 2011/0001734 A1* | 1/2011 | Kim | ............ | H05K 5/02 |
| | | | | 361/679.01 |

(Continued)

FOREIGN PATENT DOCUMENTS

| | | |
|---|---|---|
| JP | 2012070200 | 4/2012 |
| KR | 101523535 | 5/2015 |

(Continued)

*Primary Examiner* — Olisa Anwah
(74) *Attorney, Agent, or Firm* — Cantor Colburn LLP

(57) ABSTRACT

A display device includes a display panel which includes a first substrate, a second substrate, and a light emitting element layer disposed between the first substrate and the second substrate and outputting light toward the second substrate, a first sound generator which is disposed on the first substrate and outputs a first sound by vibrating the display panel, a source circuit board which is disposed on the first substrate, and a first sound circuit board which connects the first sound generator and the source circuit board.

16 Claims, 28 Drawing Sheets

(56) References Cited

U.S. PATENT DOCUMENTS

| | | | | |
|---|---|---|---|---|
| 2014/0160040 A1* | 6/2014 | Kang | .................... | H04R 17/005 |
| | | | | 345/173 |
| 2014/0334078 A1* | 11/2014 | Lee | ....................... | G06F 1/1688 |
| | | | | 361/679.01 |
| 2015/0078604 A1* | 3/2015 | Seo | ....................... | G06F 1/1635 |
| | | | | 381/333 |
| 2017/0045673 A1* | 2/2017 | Lee | ....................... | G02B 6/0056 |
| 2018/0263123 A1* | 9/2018 | Chen | ....................... | H05K 1/181 |
| 2018/0352314 A1* | 12/2018 | Lee | ....................... | H04R 1/288 |
| 2019/0018448 A1* | 1/2019 | Lee | ....................... | H04R 1/025 |
| 2019/0045287 A1* | 2/2019 | Lee | ....................... | H04R 9/025 |
| 2019/0141450 A1* | 5/2019 | Yoon | ....................... | H04R 1/028 |
| 2019/0200111 A1* | 6/2019 | Kang | ....................... | H04R 1/028 |
| 2019/0268681 A1* | 8/2019 | Masuda | ................. | H04R 9/022 |
| 2019/0341433 A1 | 11/2019 | Im et al. | | |
| 2020/0107125 A1* | 4/2020 | Choi | ....................... | H04R 1/028 |
| 2020/0374634 A1* | 11/2020 | Ohashi | .................... | G09F 9/301 |

FOREIGN PATENT DOCUMENTS

| | | |
|---|---|---|
| KR | 101782047 | 10/2017 |
| KR | 1020190076080 | 7/2019 |
| KR | 1020190090106 | 8/2019 |
| KR | 1020190126955 | 11/2019 |

\* cited by examiner

DISPLAY DEVICE

This application claims priority to Korean Patent Application No. 10-2019-0013991, filed on Feb. 1, 2019, and all the benefits accruing therefrom under 35 U.S.C. § 119, the content of which in its entirety is herein incorporated by reference.

BACKGROUND

1. Field

Exemplary embodiments of the invention relate to a display device.

2. Description of the Related Art

As an information society develops, a demand for display devices for displaying images is increasing in various forms. The display devices are being applied to various electronic devices such as smartphones, digital cameras, notebook computers, navigation devices, and smart televisions ("TVs"). The display devices may be flat panel display devices such as liquid crystal display devices, field emission display devices, and organic light emitting display devices.

SUMMARY

Display devices may include a display panel for displaying an image and a speaker for providing a sound. Here, due to space limitations of the display device, the speaker may be disposed on a lower surface or a side surface of the display panel. In this case, although it is desirable for a sound output from the speaker to be output forward from the display device, the sound is output backward or sideways from the display device. Therefore, a sound quality may be reduced.

Exemplary embodiments of the invention provide a display device capable of improving a sound quality by outputting a sound forward by vibrating a display panel using a sound generator.

Exemplary embodiments of the invention also provide a display device in which a sound generator disposed on a lower surface of a heat dissipation film and a circuit board disposed on a lower surface of a lower cover may be easily connected.

However, exemplary embodiments of the invention are not restricted to the one set forth herein. The above and other exemplary embodiments of the invention will become more apparent to one of ordinary skill in the art to which the invention pertains by referencing the detailed description of the invention given below.

An exemplary embodiment of the invention provides a display device which includes a display panel which includes a first substrate, a second substrate, and a light emitting element layer which is disposed between the first substrate and the second substrate and outputs light toward the second substrate, a first sound generator which is disposed on the first substrate and outputs a first sound by vibrating the display panel, a source circuit board which is disposed on the first substrate, and a first sound circuit board which connects the first sound generator and the source circuit board.

Another exemplary embodiment of the invention provides a display device which includes a display panel which includes a first substrate, an encapsulation film, and a light emitting element layer which is disposed on the first substrate and the encapsulation film and outputs light toward the encapsulation film, a first sound generator which is disposed on the first substrate and outputs a first sound by vibrating the display panel, a source circuit board which is disposed on the first substrate, and a first sound circuit board which connects the first sound generator and the source circuit board.

Other features and embodiments may be apparent from the following detailed description, the drawings, and the claims.

BRIEF DESCRIPTION OF THE DRAWINGS

These and/or other exemplary embodiments will become apparent and more readily appreciated from the following description of the exemplary embodiments, taken in conjunction with the accompanying drawings in which.

DETAILED DESCRIPTION

Figure 1:
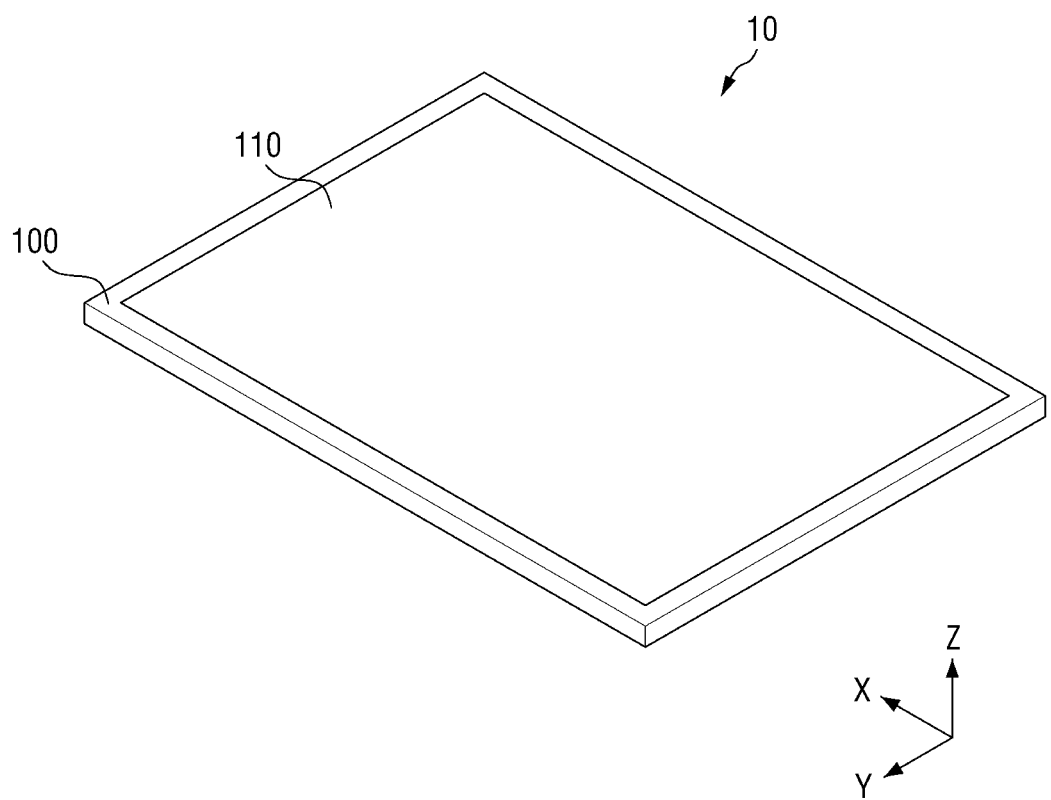
FIG. 1 is a perspective view of an exemplary embodiment of a display device.

Features of the invention and methods of accomplishing the same may be understood more readily by reference to the following detailed description of embodiments and the accompanying drawings. The invention may, however, be embodied in many different forms and should not be construed as being limited to the exemplary embodiments set forth herein. Rather, these embodiments are provided so that this invention will be thorough and complete and will fully convey the concept of the invention to those skilled in the art, and the invention will only be defined by the appended claims. Like reference numerals refer to like elements throughout the specification.

It will be understood that when an element or layer is referred to as being "on", "connected to" or "coupled to" another element or layer, it may be directly on, connected or coupled to the other element or layer or intervening elements or layers may be present. In contrast, when an element is referred to as being "directly on", "directly connected to" or "directly coupled to" another element or layer, there are no intervening elements or layers present. As used herein, the term "and/or" includes any and all combinations of one or more of the associated listed items.

Spatially relative terms, such as "beneath," "below," "lower," "above." "upper" and the like, may be used herein for ease of description to describe one element or feature's relationship to another element(s) or feature(s) as illustrated in the drawing figures. It will be understood that the spatially relative terms are intended to encompass different orientations of the device in use or operation in addition to the orientation depicted in the drawing figures. In an exemplary embodiment, when the device in the drawing figures is turned over, elements described as "below" or "beneath" other elements or features would then be oriented "above" the other elements or features. Thus, the exemplary term "below" may encompass both an orientation of above and below. The device may be otherwise oriented (rotated 90 degrees or at other orientations) and the spatially relative descriptors used herein interpreted accordingly.

It will be understood that, although the terms first, second, etc. may be used herein to describe various elements, components, regions, layers and/or sections, these elements, components, regions, layers and/or sections should not be limited by these terms. These terms are only used to distinguish one element, component, region, layer or section from another region, layer or section. Thus, a first element, component, region, layer or section discussed below could be termed a second element, component, region, layer or section without departing from the teachings of the invention.

"About" or "approximately" as used herein is inclusive of the stated value and means within an acceptable range of deviation for the particular value as determined by one of ordinary skill in the art, considering the measurement in question and the error associated with measurement of the particular quantity (i.e., the limitations of the measurement system). For example, "about" can mean within one or more standard deviations, or within ±30%, 20%, 10%, 5% of the stated value.

Unless otherwise defined, all terms (including technical and scientific terms) used herein have the same meaning as commonly understood by one of ordinary skill in the art to which this disclosure belongs. It will be further understood that terms, such as those defined in commonly used dictionaries, should be interpreted as having a meaning that is consistent with their meaning in the context of the relevant art and the present disclosure, and will not be interpreted in an idealized or overly formal sense unless expressly so defined herein.

Exemplary embodiments are described herein with reference to cross section illustrations that are schematic illustrations of idealized embodiments. As such, variations from the shapes of the illustrations as a result, for example, of manufacturing techniques and/or tolerances, are to be expected. Thus, embodiments described herein should not be construed as limited to the particular shapes of regions as illustrated herein but are to include deviations in shapes that result, for example, from manufacturing. For example, a region illustrated or described as flat may, typically, have rough and/or nonlinear features. Moreover, sharp angles that are illustrated may be rounded. Thus, the regions illustrated in the figures are schematic in nature and their shapes are not intended to illustrate the precise shape of a region and are not intended to limit the scope of the present claims.

Hereinafter, embodiments of the invention will be described with reference to the drawings.

Although an exemplary embodiment of a display device 10 is described herein as an organic light emitting display device using organic light emitting elements as light emitting elements, the invention is not limited to this case. That is, the display device 10 in the exemplary embodiment may also be an inorganic light emitting display device using micro-light emitting diodes or inorganic semiconductors (inorganic light emitting diodes) as light emitting elements.

Figure 2:
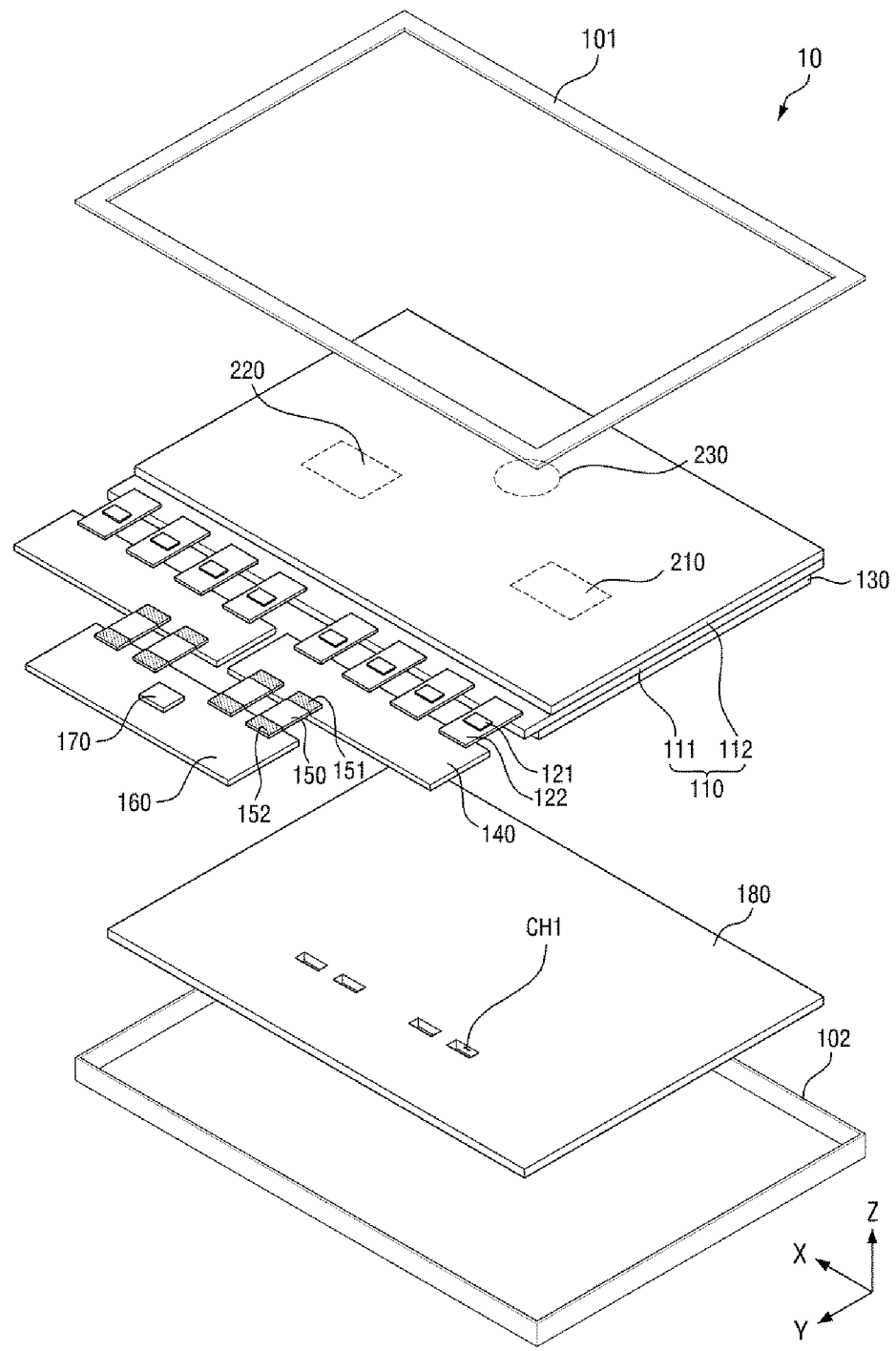
FIG. 2 is an exploded perspective view of an exemplary embodiment of the display device.

FIG. 1 is a perspective view of an exemplary embodiment of a display device 10. FIG. 2 is an exploded perspective view of an exemplary embodiment of the display device 10.

Referring to FIGS. 1 and 2, the display device 10 in the exemplary embodiment includes a set cover 100, a display panel 110, source driving circuits 121, flexible films 122, a heat dissipation film 130, source circuit boards 140, cables 150, a control circuit board 160, a timing control circuit 170, and a lower cover 180.

In the specification, the terms "above", "top" and "upper surface" indicate a direction in which a second substrate 112 is disposed with respect to a first substrate 111 of the display panel 110, that is, a Z-axis direction, and the terms "below," "bottom" and "lower surface" indicate a direction in which the heat dissipation film 130 is disposed with respect to the first substrate 111 of the display panel 110, that is, a direction opposite to the Z-axis direction. In addition, "left," "right," "upper" and "lower" indicate directions when the display panel 110 is viewed in a plan view. For example, "right" indicates an X-axis direction, "left" indicates a direction opposite to the X-axis direction, "upper" indicates a Y-axis direction, and "lower" indicates a direction opposite to the Y-axis direction.

The set cover 100 may surround edges of the display panel 110. The set cover 100 may cover a non-display area excluding a display area of the display panel 110. Specifically, the set cover 100 may include an upper set cover 101 and a lower set cover 102 as illustrated in FIG. 2. The upper set cover 101 may cover edges of an upper surface of the display panel 110, and the lower set cover 102 may cover lower and side surfaces of the display panel 110. The upper set cover 101 and the lower set cover 102 may be coupled to each other by fixing members such as screws or an adhesive member such as a double-sided tape or an adhesive. The upper set cover 101 and the lower set cover 102 may include plastic or metal or may include both plastic and metal.

The display panel 110 may be rectangular in a plan view In an exemplary embodiment, the display panel 110 may have a rectangular planar shape having long sides in a first direction (X-axis direction) and short sides in a second direction (Y-axis direction) as illustrated in FIG. 2, for example. Each corner where a long side extending in the first direction (X-axis direction) meets a short side extending in the second direction (Y-axis direction) may be right-angled or may be rounded with a predetermined curvature. The planar shape of the display panel 110 is not limited to the rectangular shape, but may also be another polygonal shape, a circular shape or an elliptical shape.

In FIG. 2, the display panel 110 is provided flat. However, the invention is not limited to this case. The display panel 110 may also be bent with a predetermined curvature.

The display panel 110 may include the first substrate 111, the second substrate 112 and a pixel array layer 113. A detailed description of the pixel array layer 113 will be described later with reference to FIG. 11. The first substrate 111 and the second substrate 112 may be rigid or flexible. The first substrate 111 may include glass or plastic, and the second substrate 112 may include glass, plastic, an encapsulation film, or a barrier film. In an exemplary embodiment, the plastic may be polyethersulphone ("PES"), polyacrylate ("PA"), polyarylate ("PAR"), polyetherimide ("PEI"), polyethylene naphthalate ("PEN"), polyethylene terepthalate ("PET"), polyphenylene sulfide ("PPS"), polyallylate, polyimide ("PI"), polycarbonate ("PC"), cellulose triacetate ("CAT"), cellulose acetate propionate ("CAP"), or any combination of these materials. The encapsulation film or the barrier film may be a film in which a plurality of inorganic layers are stacked.

In another exemplary embodiment, the second substrate 112 may be omitted. In this case, a thin-film encapsulation layer instead of the second substrate 112 may be disposed on the first substrate 111.

Figure 11:
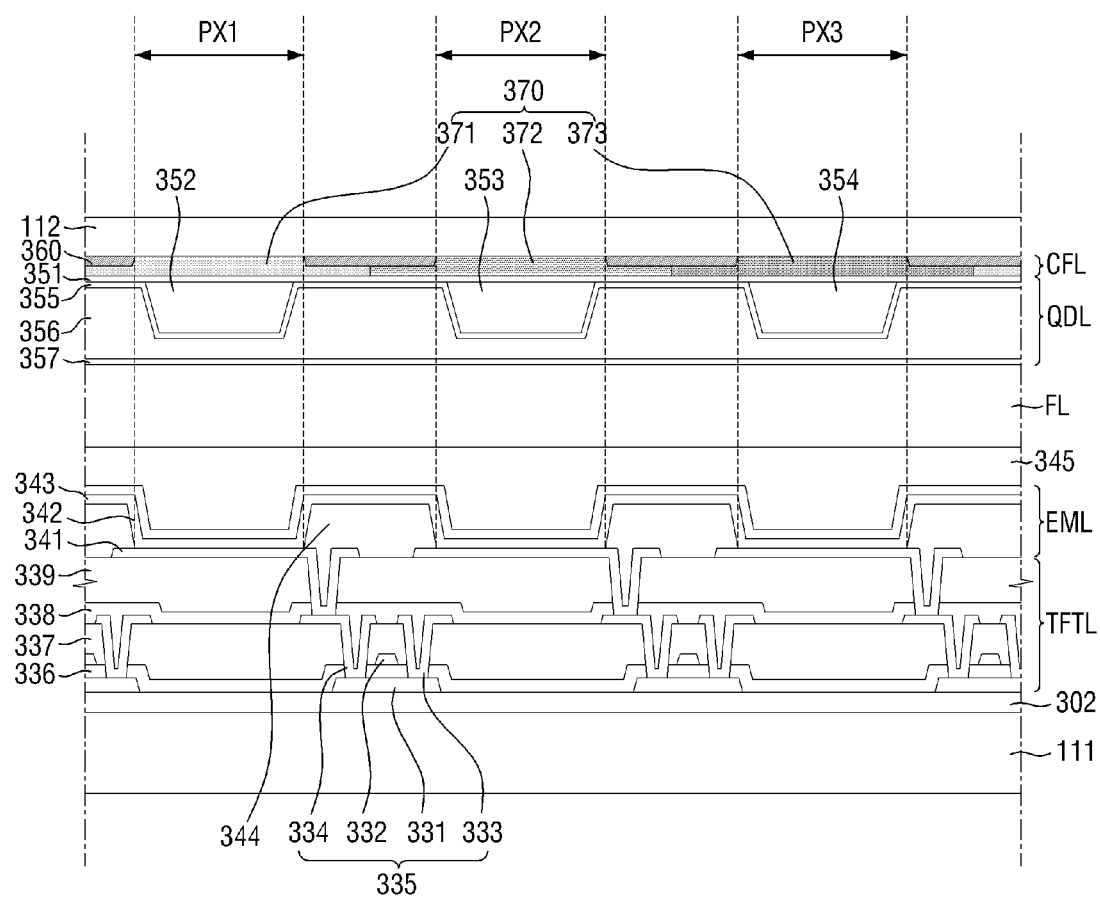
FIG. 11 is a cross-sectional view of an exemplary embodiment of a display area of a display panel.

The display panel 110 may include a thin-film transistor layer TFTL, a light emitting element layer EML, a filler FL, a wavelength conversion layer QDL, and a color filter layer CFL as illustrated in FIG. 11. In this case, the first substrate 111 may be a thin-film transistor substrate in which the thin-film transistor layer TFTL, the light emitting element layer EML and an encapsulation film 345 are provided, the second substrate 112 may be a color filter substrate in which the wavelength conversion layer QDL and the color filter layer CFL are provided, and the filler FL may be disposed between the encapsulation film 345 of the first substrate 111 and the wavelength conversion layer QDL of the second substrate 112. The thin-film transistor layer TFTL, the light emitting element layer EML, the filler FL, the wavelength conversion layer QDL and the color filter layer CFL of the display panel 110 will be described in detail later with reference to FIG. 11.

A side of each of the flexible films 122 may be attached onto a surface of the first substrate 111 of the display panel 110, and the other side may be attached onto a surface of one of the source circuit boards 140. Specifically, since the first substrate 111 is larger in size than the second substrate 112, a side of the first substrate 111 may be exposed without being covered by the second substrate 112. The flexible films 122 may be attached to the exposed side of the first substrate 111 which is not covered by the second substrate 112. Each of the flexible films 122 may be attached onto the surface of the first substrate 111 and the surface of one of the source circuit boards 140 by an anisotropic conductive film.

Figure 3:
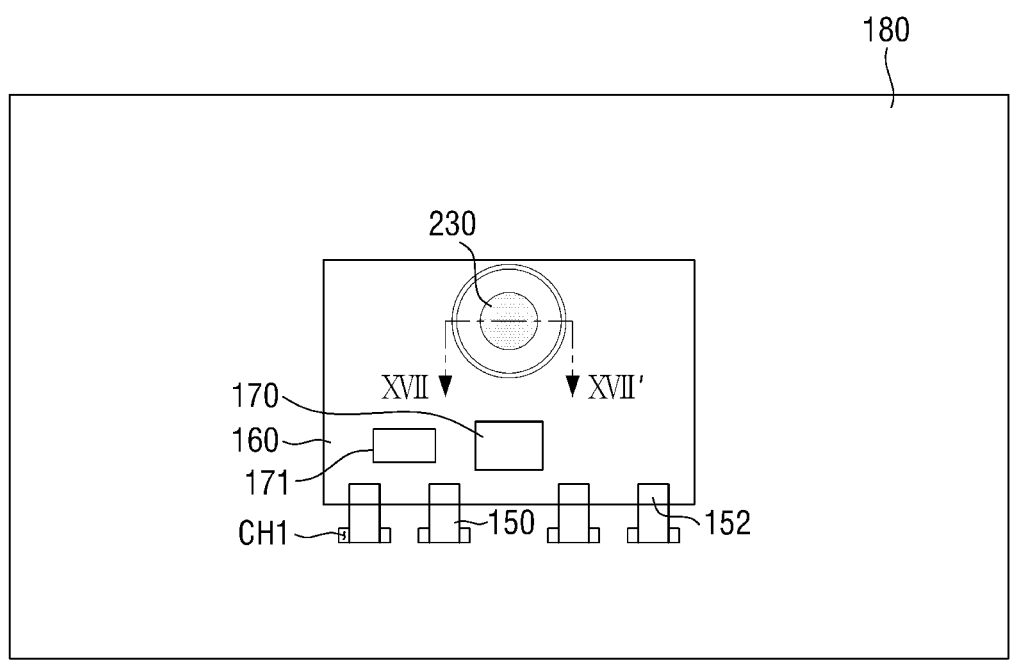
FIG. 3 is a bottom view of an exemplary embodiment of the display device.
Figure 3:
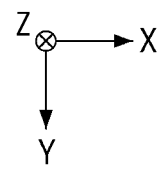
Figure 4:
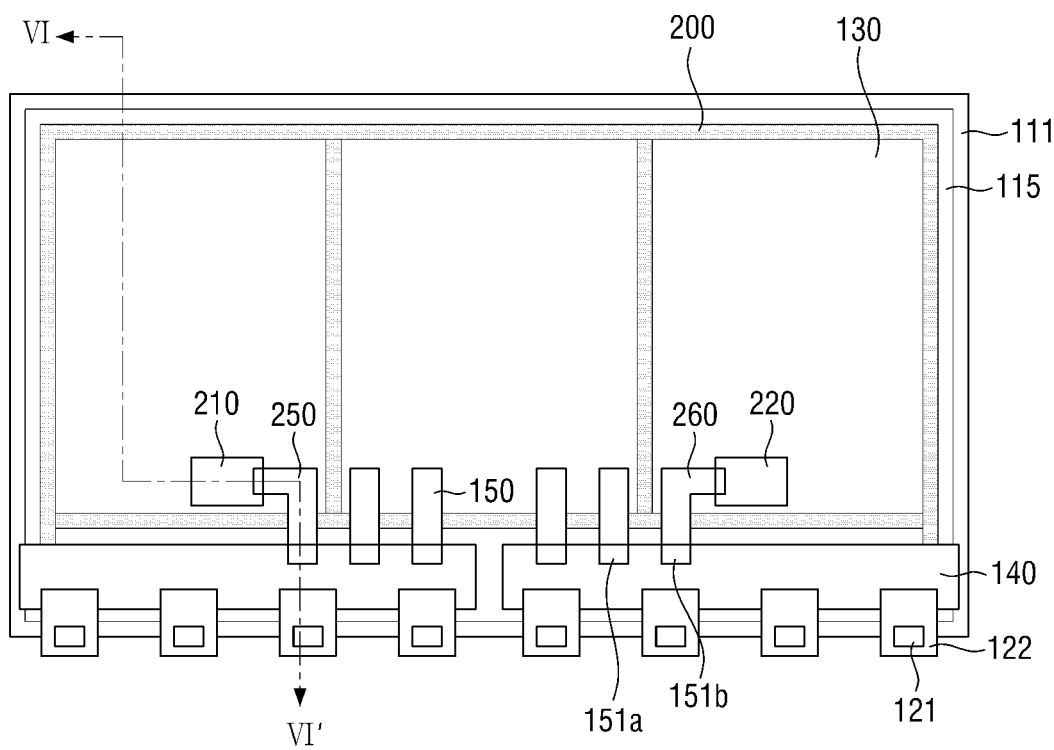
FIG. 4 is a bottom view of the display device excluding a lower cover and a control circuit board from FIG. 3.

Each of the flexible films 122 may be a tape carrier package ("TCP") or a chip on film ("COF"). Each of the flexible films 122 is bendable. Therefore, the flexible films 122 may be bent toward a lower surface of the first substrate 111 as illustrated in FIGS. 3 and 4. In this case, the source circuit boards 140, the cables 150, and the control circuit board 160 may be disposed on the lower surface of the first substrate 111.

Although eight flexible films 122 are attached onto the first substrate 111 of the display panel 110 in FIG. 2, the number of the flexible films 122 is not limited to eight.

The source driving circuits 121 may be disposed on surfaces of the flexible films 122, respectively. The source driving circuits 121 may be provided as integrated circuits ("ICs"). Each of the source driving circuits 121 converts digital video data into analog data voltage according to a source control signal of the timing control circuit 170 and supplies the analog data voltage to data lines of the display panel 110 through the flexible films 122.

Each of the source circuit boards 140 may be connected to the control circuit board 160 by the cables 150. To this end, each of the source circuit boards 140 may include first connectors 151a for connection to the cables 150. The source circuit boards 140 may be flexible printed circuit boards ("FPCBs") or printed circuit boards ("PCBs"). The cables 150 may be flexible cables.

The control circuit board 160 may be connected to the source circuit boards 140 via the cables 150. To this end, the control circuit board 160 may include second connectors 152 for connection to the cables 150. The control circuit board 160 may be an FPCB or a PCB.

Although four cables 150 connect the source circuit boards 140 and the control circuit board 160 in FIG. 2, the number of the cables 150 is not limited to four. In addition, although two source circuit boards 140 are illustrated in FIG. 2, the number of the source circuit boards 140 is not limited to two.

The timing control circuit 170 may be disposed on a surface of the control circuit board 160. The timing control circuit 170 may be provided as an IC. The timing control circuit 170 may receive digital video data and timing signal from a system on chip of a system circuit board and generate a source control signal for controlling the timings of the source driving circuits 121 according to the timing signal.

The system on chip may be disposed (e.g., mounted) on the system circuit board connected to the control circuit board 160 via another flexible cable and may be provided as an IC. The system on chip may be a processor of a smart television, a central processing unit ("CPU") or graphics card of a computer or notebook, or an application processor of a smartphone or tablet personal computer ("PC"). The system circuit board may be an FPCB or a PCB.

A power supply circuit may be additionally attached onto the surface of the control circuit board 160. The power supply circuit may generate voltage necessary for driving the display panel 110 from main power received from the system circuit board and supply the generated voltage to the display panel 110. In an exemplary embodiment, the power supply circuit may generate a high-potential voltage, a low-potential voltage and an initialization voltage for driving organic light emitting elements and supply the generated voltage to the display panel 110, for example. In addition, the power supply circuit may generate driving voltage for driving the source driving circuits 121, the timing control circuit 170, etc., and supply the generated voltage. The power supply circuit may be provided as an IC. In an alternative exemplary embodiment, the power supply circuit may be disposed on a power circuit board provided separately from the control circuit board 160. The power circuit board may be an FPCB or a PCB.

The heat dissipation film 130 may be disposed on a surface of the first substrate 111 which does not face the second substrate 112, that is, on the lower surface of the first substrate 111. In addition, first through third sound generators 210 through 230 may be disposed on a surface of the heat dissipation film 130 which does not face the first substrate 111, that is, on a lower surface of the heat dissipation film 130. The heat dissipation film 130 dissipates heat generated by the first through third sound generators 210 through 230. To this end, the heat dissipation film 130 may include a metal layer having high thermal conductivity, such as graphite, silver (Ag), copper (Cu) or aluminum (Al).

In addition, the heat dissipation film 130 may include a plurality of graphite layers or a plurality of metal layers provided in the first direction (X-axis direction) and the second direction (Y-direction), not in a third direction (Z-direction). In this case, since the heat generated by the first through third sound generators 210 through 230 may be diffused in the first direction (X-axis direction) and the second direction (Y-axis direction), it may be released more effectively. Therefore, the heat dissipation film 130 may minimize the effect of the heat generated by the first through third sound generators 210 through 230 on the display panel 110.

In an exemplary embodiment, a thickness D1 of the heat dissipation film 130 may be different from a thickness D2 of the first substrate 111 and a thickness D3 of the second substrate 112. Specifically, in order to prevent the heat generated by the first through third sound generators 210 through 230 from affecting the display panel 110, the thickness D1 of the heat dissipation film 130 may be greater than the thickness D2 of the first substrate 111 and the thickness D3 of the second substrate 112.

The size of the heat dissipation film 130 may be smaller than that of the first substrate 111. Therefore, edges of a surface of the first substrate 111 may be exposed without being covered by the heat dissipation film 130. In another exemplary embodiment, the heat dissipation film 130 may be omitted.

The first through third sound generators 210 through 230 may be disposed on the heat dissipation film 130. The first through third sound generators 210 through 230 may be vibration devices capable of vibrating the display panel 110 in the third direction (Z-axis direction). In this case, the display panel 110 may serve as a diaphragm for outputting a sound.

Figure 12:
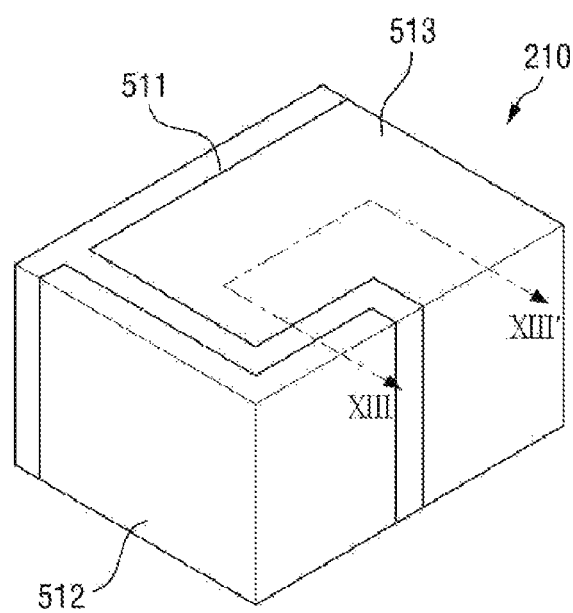
FIG. 12 is a perspective view of an exemplary embodiment of a first sound generator and a second sound generator.
Figure 13:
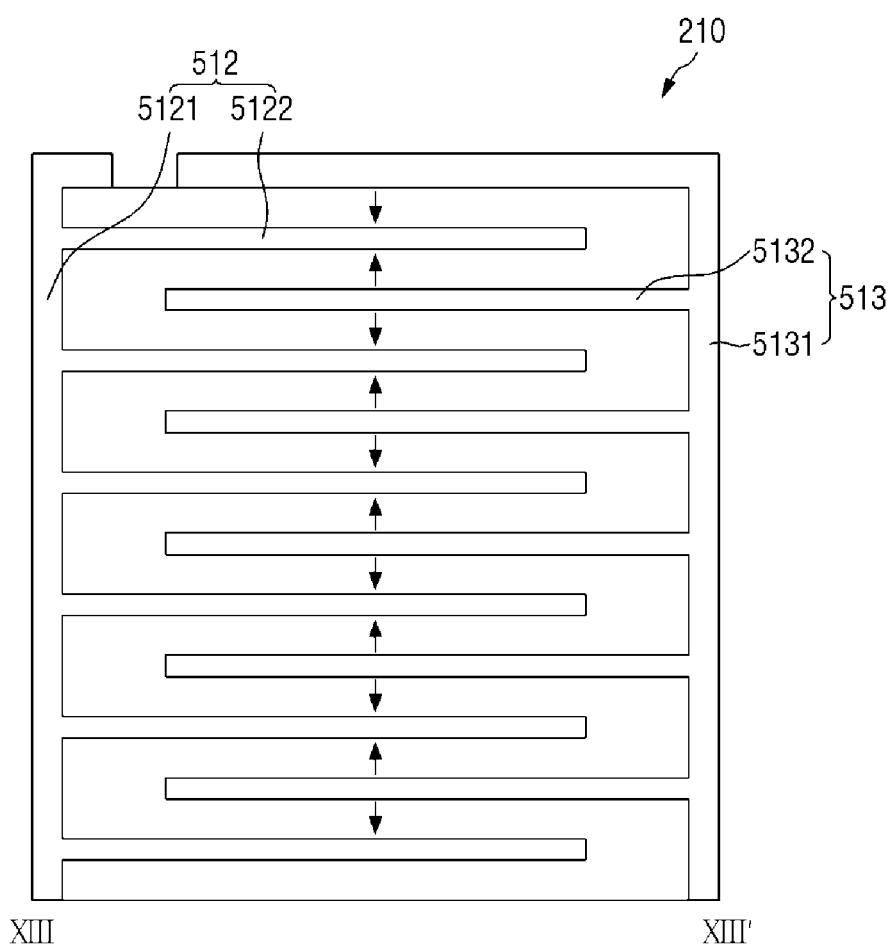
FIG. 13 is a cross-sectional view taken along line XIII-XIII' of FIG. 12.

Specifically, each of the first sound generator 210 and the second sound generator 220 may be a piezoelectric element that vibrates the display panel 110 by contracting or expanding according to an applied voltage as illustrated in FIGS. 12 and 13. The first sound generator 210 and the second sound generator 220 may serve as high-pitched sound generators that output a high-pitched sound.

Figure 17:
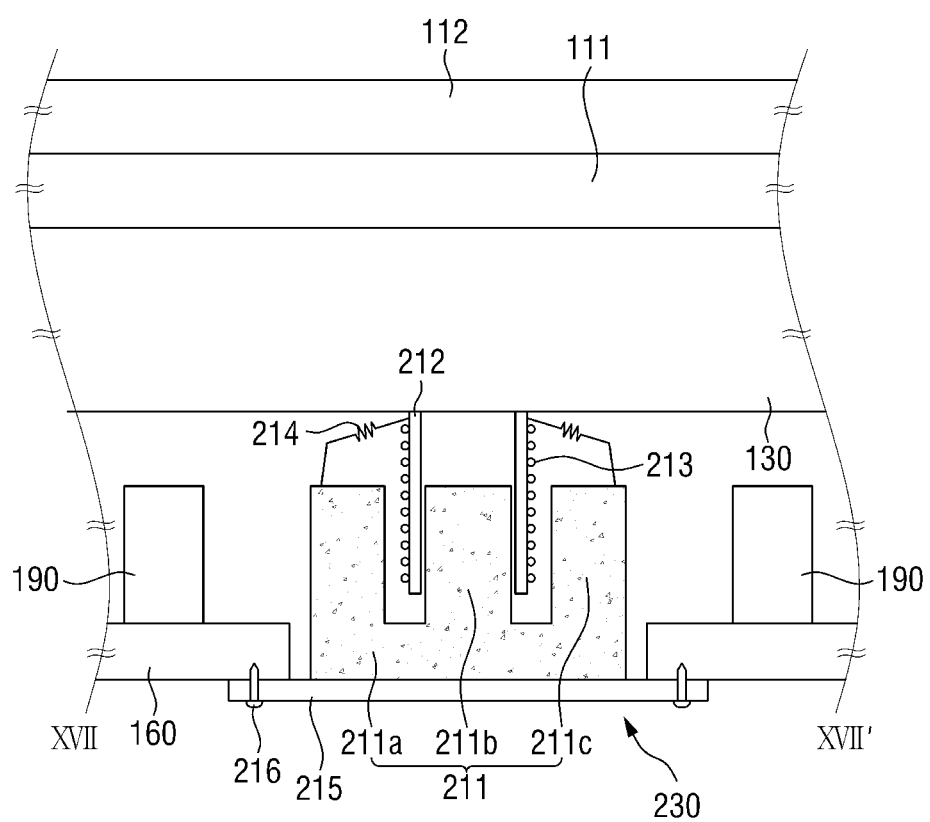
FIG. 17 is a cross-sectional view taken along line XVII-XVII' of FIG. 3.
Figure 18:
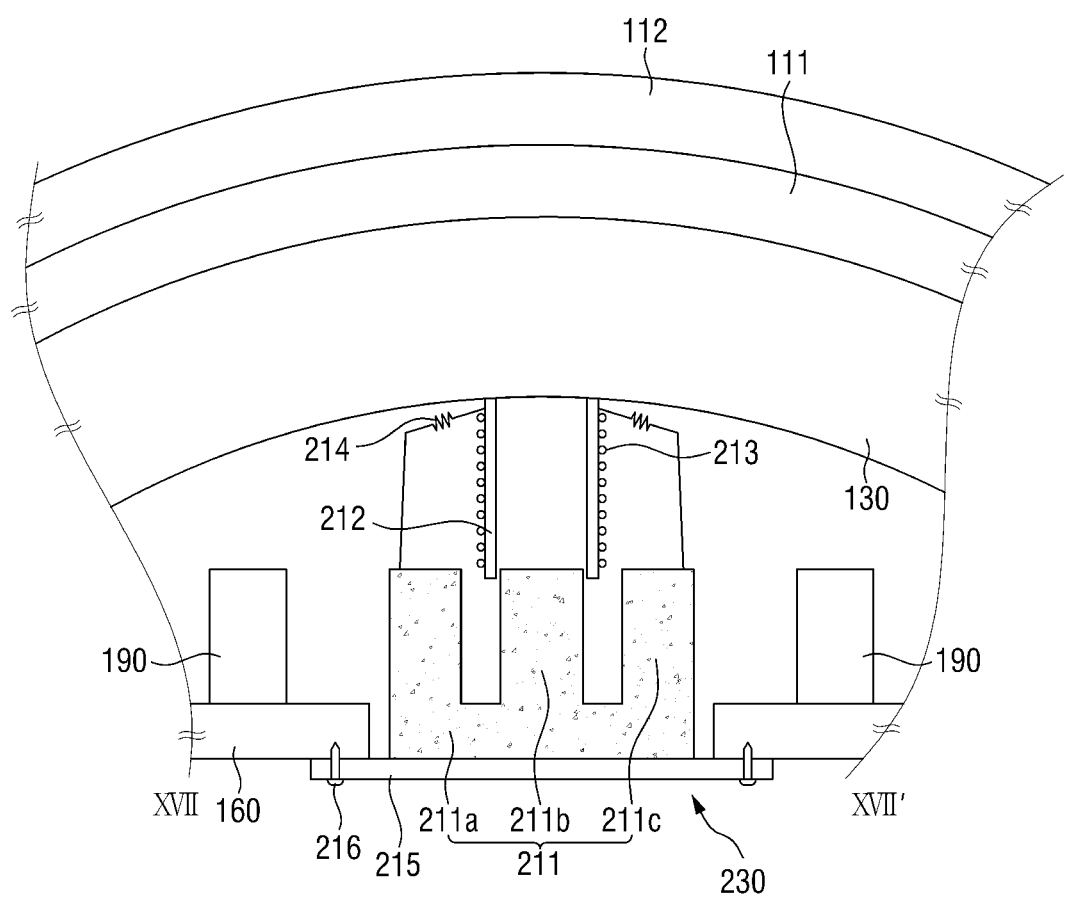
FIGS. 18 and 19 illustrate an exemplary embodiment of a case where the display panel is vibrated by the vibration of a third sound generator.
Figure 19:
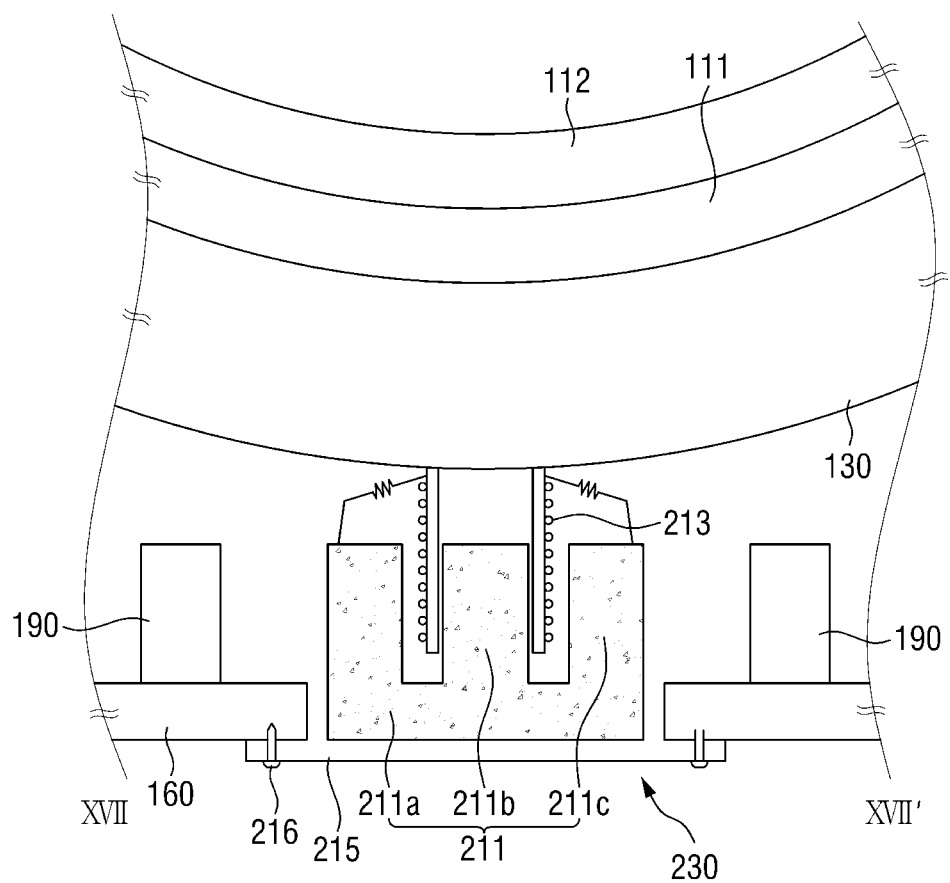

In addition, the third sound generator 230 may be an exciter that vibrates the display panel 110 by generating a magnetic force using a voice coil as illustrated in FIGS. 17 through 19 or may be a linear resonant actuator ("LRA") or an eccentric rotating mass ("ERM") that vibrates the display panel 110 by generating a magnetic force using a voice coil. A case where the third sound generator 230 is an exciter will be mainly described below. The third sound generator 230 may serve as a mid- to low-pitched sound generator that outputs a mid- to low-pitched sound lower than the sound output by the first sound generator 210 and the second sound generator 220.

Although the display device 10 includes three sound generators 210 through 230 in FIGS. 2 through 4, the number of the sound generators 210 through 230 is not limited to three. The first sound generator 210 and the second sound generator 220 will be described in detail later with reference to FIGS. 12 through 16. The third sound generator 230 will be described in detail later with reference to FIGS. 17 through 19.

A blocking member 200 may be disposed on a surface of the heat dissipation film 130. The blocking member 200 prevents the propagation of the vibration of the display panel 110 caused by each of the first through third sound generators 210 through 230 or the transmission of a sound generated by the vibration of the display panel 110. The blocking member 200 may be attached to the surface of the heat dissipation film 130 and a surface of the lower cover 180 in order to block the propagation of the vibration of the display panel 110 or the transmission of a sound.

The blocking member 200 may be disposed at four edges of the heat dissipation film 130. The blocking member 200 may define a vibration area of each sound generator and prevent vibrations generated by a sound generator on one side from affecting an adjacent sound generator on the other side. The blocking member 200 may be disposed between the heat dissipation film 130 and the lower cover 180 to bond the surface of the heat dissipation film 130 and the surface of the lower cover 180. The blocking member 200 will be described in detail later with reference to FIGS. 6 through 10.

The lower cover 180 may be disposed on the surface of the heat dissipation film 130. The lower cover 180 may be attached to the edges of the surface of the first substrate 111 of the display panel 110 by a first adhesive member 115. The first adhesive member 115 may be a double-sided tape including a buffer layer such as foam. The lower cover 180 may be metal or tempered glass. In an exemplary embodiment, first cable holes CH1 penetrating the lower cover 180 may defined in the lower cover 180. This will be described in detail later.

As described above, the display device 10 illustrated in FIGS. 1 and 2 may output a sound using the display panel 110 as a diaphragm through the first through third sound generators 210 through 230. That is, since the sound may be output forward from the display device 10, a sound quality may be improved. In addition, the first through third sound generators 210 through 230 make it possible to omit a speaker generally provided on a lower surface or a side of a conventional display panel.

Although the display device 10 in the exemplary embodiment is a medium- and large-sized display device including a plurality of source driving circuits 121 in FIGS. 1 and 2, the invention is not limited to this case. That is, the display device 10 in the exemplary embodiment may also be a small-sized display device including one source driving circuit 121. In this case, the flexible films 122, the source circuit boards 140, and the cables 150 may be omitted. In addition, the source driving circuits 121 and the timing control circuit 170 may be integrated into one IC and then attached onto one flexible circuit board or attached onto the first substrate 111 of the display panel 110. Examples of the medium- and large-sized display device include monitors and televisions, and examples of the small-sized display device include smartphones and tablet PCs.

Figure 5:
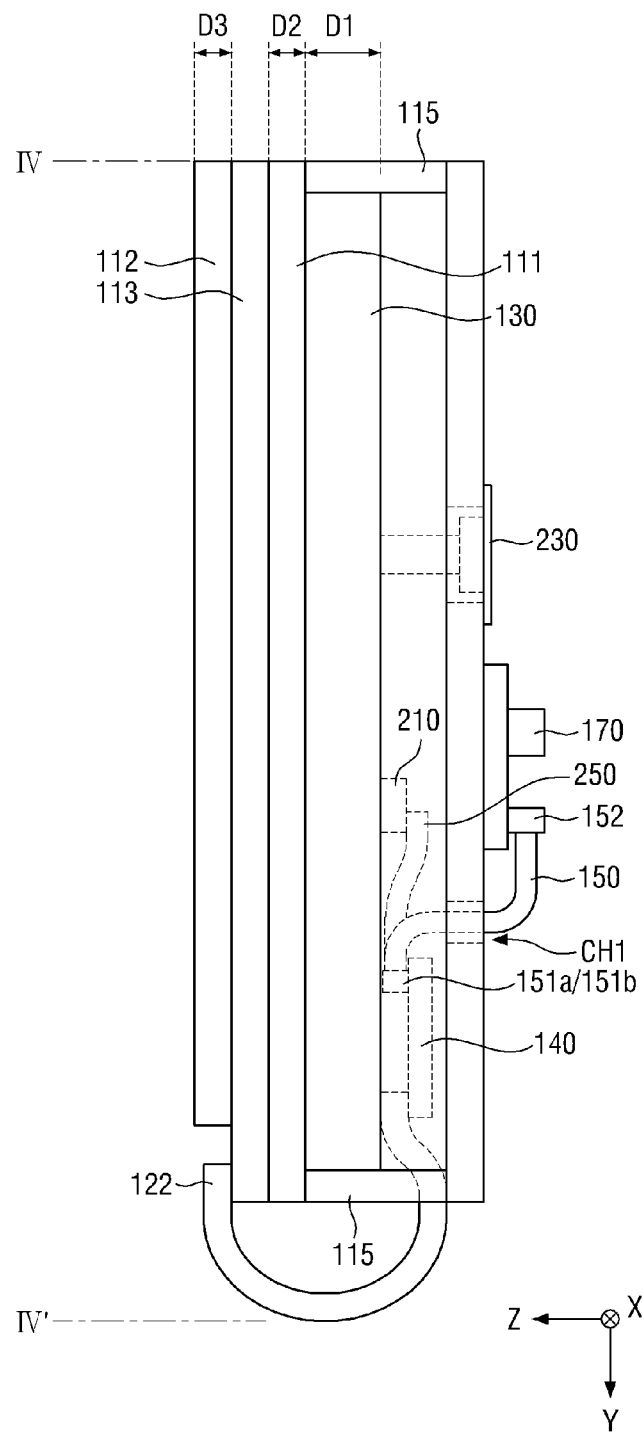
FIG. 5 is a side view of an exemplary embodiment of the display device.

FIG. 3 is a bottom view of an exemplary embodiment of the display device 10. FIG. 4 is a bottom view of the display device 10 excluding the lower cover 180 and the control circuit board 160 from FIG. 3. FIG. 5 is a side view of an exemplary embodiment of the display device 10.

Referring to FIGS. 3 through 6, the flexible films 122 may be bent toward the lower surface of the display panel 110. Therefore, the source circuit boards 140 may be disposed on the surface of the heat dissipation film 130.

While the source circuit boards 140 are disposed on the surface of the heat dissipation film 130, the control circuit board 160 is disposed on a surface of the lower cover 180. That is, the source circuit boards 140 are disposed between the surface of the heat dissipation film 130 and the other surface of the lower cover 180. Therefore, the cables 150 connected to the first connectors 151a of the source circuit boards 140 may be connected to the second connectors 152 of the control circuit board 160 through the first cable holes CH1 penetrating the lower cover 180. This may further simplify wiring connection and ensure process economic feasibility.

The first sound generator 210 and the second sound generator 220 may be attached onto the surface of the heat dissipation film 130 by an adhesive member such as a double-sided adhesive. The first sound generator 210 may be connected to a $(1B)^{th}$ connector 151b of a source circuit board 140 by a first sound circuit board 250, and the second sound generator 220 may be connected to a $(1B)^{th}$ connector 151b of a source circuit board 140 by a second sound circuit board 260. A first pad and a second pad connected to a first electrode and a second electrode disposed on a surface of the first sound generator 210 may be disposed on a side of the first sound circuit board 250. A first pad and a second pad connected to a first electrode and a second electrode disposed on a surface of the second sound generator 220 may be disposed on a side of the second sound circuit board 260.

Connection portions for connection to the $(1B)^{th}$ connectors 151b of the source circuit boards 140 may be disposed on the other side of the first sound circuit board 250 and the other side of the second sound circuit board 260. That is, the first sound generator 210 may be electrically connected to the source circuit board 140 by the first sound circuit board 250, and the second sound generator 220 may be electrically connected to the source circuit board 140 by the second sound circuit board 260. The first sound circuit board 250 and the second sound circuit board 260 may be FPCBs or flexible cables.

A sound driving circuit 171 and the third sound generator 230 as well as the timing control circuit 170 may be disposed on the control circuit board 160.

The sound driving circuit 171 may receive a sound control signal, which is a digital signal, from the system circuit board. The sound driving circuit 171 may be provided as an IC and may be disposed on the control circuit board 160 or the system circuit board. In an exemplary embodiment, the sound driving circuit 171 may include a digital signal processor ("DSP") for processing a sound control signal which is a digital signal, a digital-to-analog converter ("DAC") for converting the digital signal processed by the DSP into driving voltage which are analog signal, and an amplifier ("AMP") for amplifying the analog driving voltage output from the DAC and outputting the amplified analog driving voltage. The analog driving voltage may include a positive driving voltage and a negative driving voltage.

The sound driving circuit 171 may generate a first sound signal including a $(1A)^{th}$ driving voltage and a $(1B)^{th}$ driving voltage for driving the first sound generator 210 and a second sound signal including a $(2A)^{th}$ driving voltage and a $(2B)^{th}$ driving voltage for driving the second sound generator 220 according to a sound control signal. In addition, the sound driving circuit 171 may generate a third sound signal including a $(3A)^{th}$ driving voltage and a $(3B)^{th}$ driving voltage for driving the third sound generator 230 according to the sound control signal.

The first sound generator 210 may receive the first sound signal including the $(1A)^{th}$ driving voltage and the $(1B)^{th}$ driving voltage from the sound driving circuit 171. The first sound generator 210 may output a sound by vibrating the display panel 110 according to the $(1A)^{th}$ driving voltage and the $(1B)^{th}$ driving voltage.

The second sound generator 220 may receive the second sound signal including the $(2A)^{th}$ driving voltage and the $(2B)^{th}$ driving voltage from the sound driving circuit 171. The second sound generator 220 may output a sound by vibrating the display panel 110 according to the $(2A)^{th}$ driving voltage and the $(2B)^{th}$ driving voltage.

When the sound driving circuit 171 and the third sound generator 230 are disposed on the control circuit board 160 as illustrated in FIG. 3, the sound driving circuit 171 and the third sound generator 230 may be electrically connected by metal lines of the control circuit board 160.

It should be noted that the number of sound generators implemented as exciters and the number of sound generators implemented as piezoelectric elements are not limited to those illustrated in FIGS. 3 and 4.

In addition, the sound driving circuit 171 may be disposed on the control circuit board 160, and the first sound generator 210 and the second sound generator 220 may be disposed on the surface of the heat dissipation film 130. In this case, the first sound signal of the sound driving circuit 171 may be transmitted to the first sound generator 210 via the cables 150, the source circuit board 140, and the first sound circuit board 250. In addition, the second sound signal of the sound driving circuit 171 may be transmitted to the second sound generator 220 via the cables 150, the source circuit board 140, and the second sound circuit board 260.

In the exemplary embodiment of FIGS. 3 through 6, the first sound generator 210 and the source circuit board 140 are connected by the first sound circuit board 250, and the second sound generator 220 and the source circuit board 140 are connected by the second sound circuit board 260. Therefore, even when the first sound generator 210 and the second sound generator 220 are disposed on the surface of the heat dissipation film 130 while the control circuit board 160 is disposed on the surface of the lower cover 180, the control circuit board 160 and the first sound generator 210 may be easily electrically connected to each other, and the control circuit board 160 and the second sound generator 220 may be easily electrically connected to each other.

Figure 6:
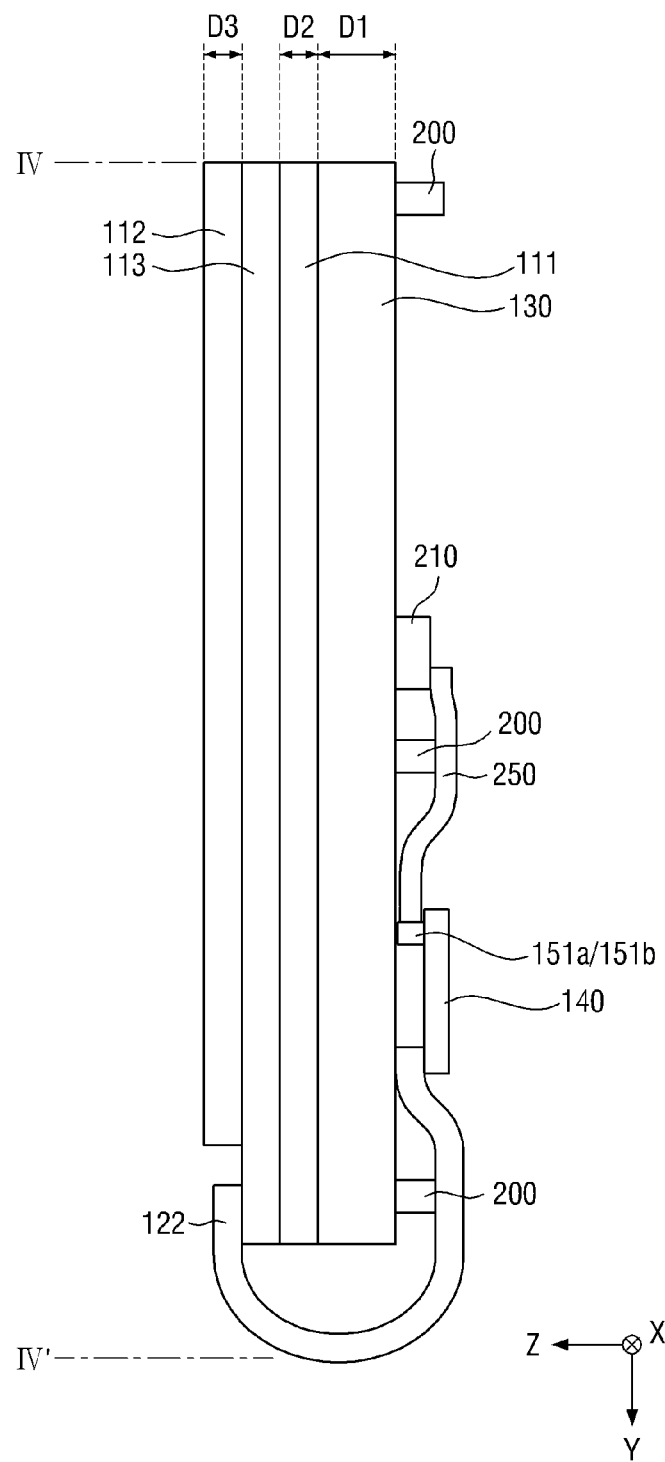
FIG. 6 is a cross-sectional view taken along line VI-VI' of FIG. 4.

The arrangement of the blocking member 200 will now be described in more detail. FIG. 6 is a cross-sectional view taken along line VI-VI' of FIG. 4.

Referring to FIG. 6, the blocking member 200 of the display device 10 in the exemplary embodiment may be disposed between the first sound circuit board 250 and the heat dissipation film 130. Specifically, the blocking member 200 may be attached onto the surface of the heat dissipation film 130, and the first sound generator 210 and the source circuit board 140 may be connected to each other. In this case, a surface of the blocking member 200 may contact the heat dissipation film 130, and the other surface of the blocking member 200 may contact the first sound circuit board 250. Since the blocking member 200 is disposed on the heat dissipation film 130 to directly contact the heat dissipation film 130, vibrations generated by an adjacent sound generator may be more effectively blocked.

In addition, although only the first sound circuit board 250 is illustrated in the drawing, the invention is not limited to this case, and the blocking member 200 may also be disposed between the second sound circuit board 260 and the heat dissipation film 130.

FIGS. 7 through 10 illustrate the arrangement of the blocking member 200 and the sound generators 210 through 230.

In FIGS. 7 through 10, only the first substrate 111 of the display panel 110, the heat dissipation film 130, the blocking member 200, and the first through third sound generators 210 through 230 are illustrated for ease of description. That is, the source driving circuits 121, the flexible films 122, the source circuit boards 140, the cables 150, the control circuit board 160, the timing control circuit 170 and the lower cover 180 are omitted from FIGS. 7 through 10.

Figure 7:
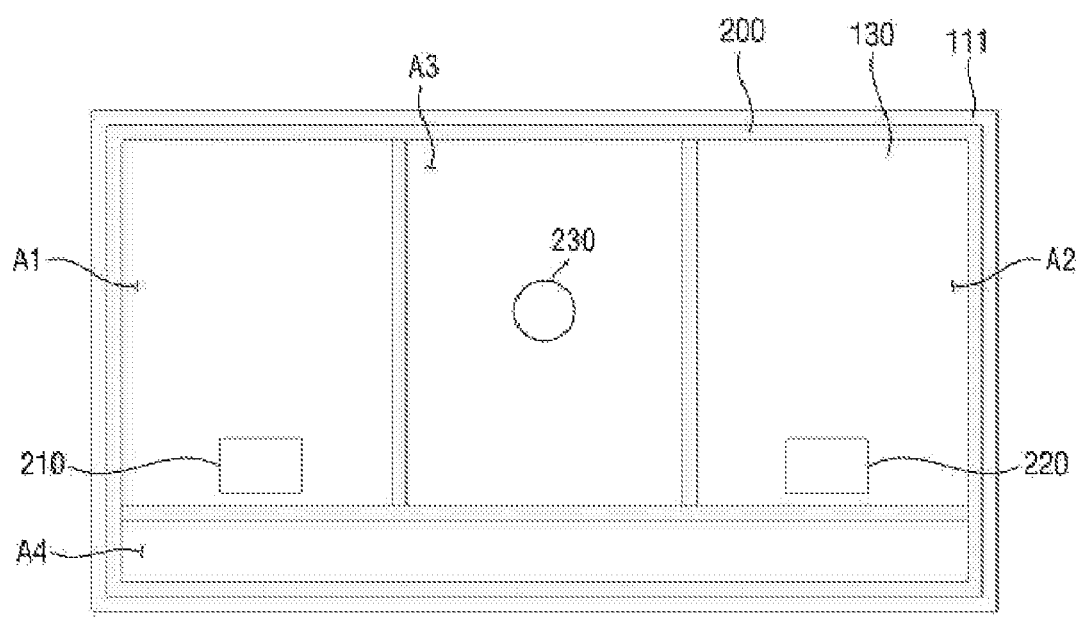
FIGS. 7 through 10 illustrate the arrangement of a blocking member and sound generators.

The arrangement of the blocking member 200 in FIG. 7 may be substantially the same as the arrangement of the blocking member 200 in FIG. 4. Referring to FIG. 7, the size of the heat dissipation film 130 may be smaller than that of the first substrate 111. Thus, the four edges of the surface of the first substrate 11 may be exposed without being covered by the heat dissipation film 130.

The blocking member 200 may be disposed at the four edges of the surface of the first substrate 111. The surface of the heat dissipation film 130 may be divided into first through fourth areas A1 through A4 by the blocking member 200 as illustrated in FIG. 7.

The first area A1 is an area where the first sound generator 210 is disposed and may be defined by the blocking member 200 disposed to surround the first sound generator 210. The second area A2 is an area where the second sound generator 220 is disposed and may be defined by the blocking member 200 disposed to surround the second sound generator 220. The size of the first area A1 and the size of the second area A2 may be substantially the same.

The third area A3 is an area where the third sound generator 230 is disposed and may be defined by the blocking member 200 disposed to surround the third sound generator 230. In an exemplary embodiment, the size of the first area A1 and/or the size of the second area A2 may be different from the size of the third area A3. Specifically the size of the first area A1 and/or the size of the second area A2 may be smaller than the size of the third area A3.

The fourth area A4 is an area where the source circuit boards 140 are disposed and may be defined by the blocking member 200 disposed to surround the source circuit boards 140. Due to the fourth area A4, the source circuit boards 140, the source driving circuits 121 and the flexible films 122 may be prevented from being affected by the first through third sound generators 210 through 230 of the first through third areas A1 through A3, or the effect may be reduced.

In the exemplary embodiment illustrated in FIG. 7, each of the first through third sound generators 210 through 230 is surrounded by the blocking member 200. Therefore, the vibration of the display panel 110 caused by each of the first through third sound generators 210 through 230 may be prevented from being affected by the vibration of the display panel 110 caused by an adjacent sound generator, or the effect may be reduced.

Figure 8:
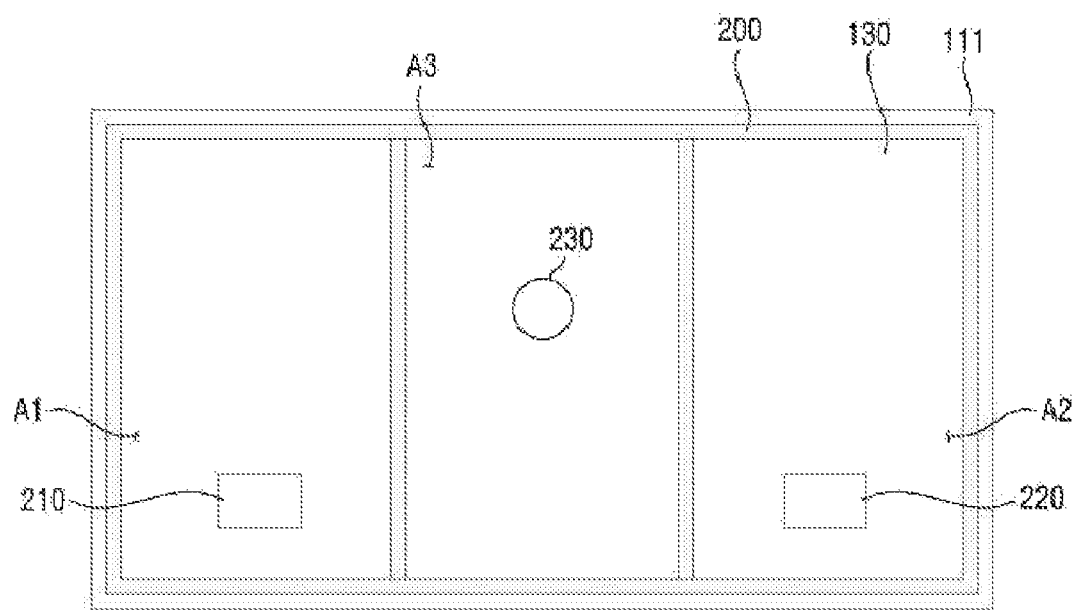

In addition, the surface of the heat dissipation film 130 may be divided into first through third areas A1 through A3 by the blocking member 200 as illustrated in FIG. 8.

The first through third areas A1 through A3 may be vertically separated by a plurality of blocking members 200 extending in the second direction and may be arranged parallel to each other in the first direction. In another exemplary embodiment, the fourth area A4 in which the source circuit boards 140 are disposed may be omitted.

Figure 9:
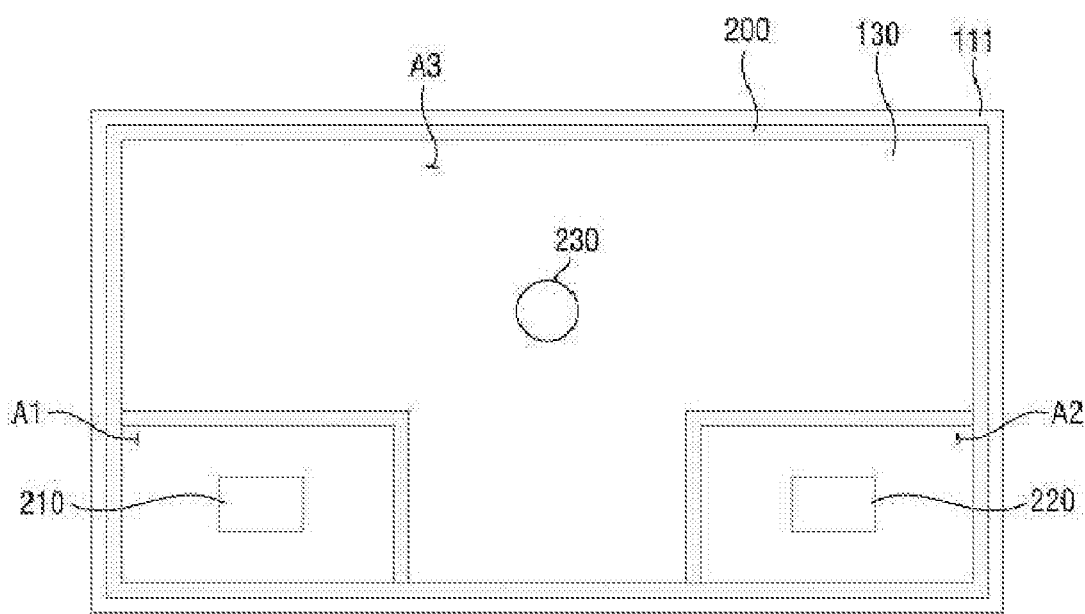
Figure 9:
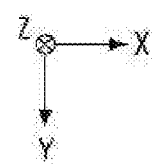

In addition, the surface of the heat dissipation film 130 may be divided into first through third areas A1 through A3 by the blocking member 200 as illustrated in FIG. 9.

The first area A1 may be defined by the blocking member 200 disposed to surround the first sound generator 210. The second area A2 may be defined by the blocking member 200 disposed to surround the second sound generator 220. The third area A3 may be an area excluding the first area A1 and the second area A2. In an exemplary embodiment, the size of the first area A1 and/or the size of the second area A2 may be different from the size of the third area A3. Specifically, the size of the first area A1 and/or the size of the second area A2 may be smaller than the size of the third area A3.

The blocking member 200 illustrated in FIG. 9 is disposed closer to the first sound generator 210 and the second sound generator 220 than the blocking member 200 illustrated in FIG. 7. Therefore, vibrations generated by each of the first sound generator 210 and the second sound generator 220 may be prevented from affecting another adjacent sound generator, or the effect may be reduced.

Figure 10:
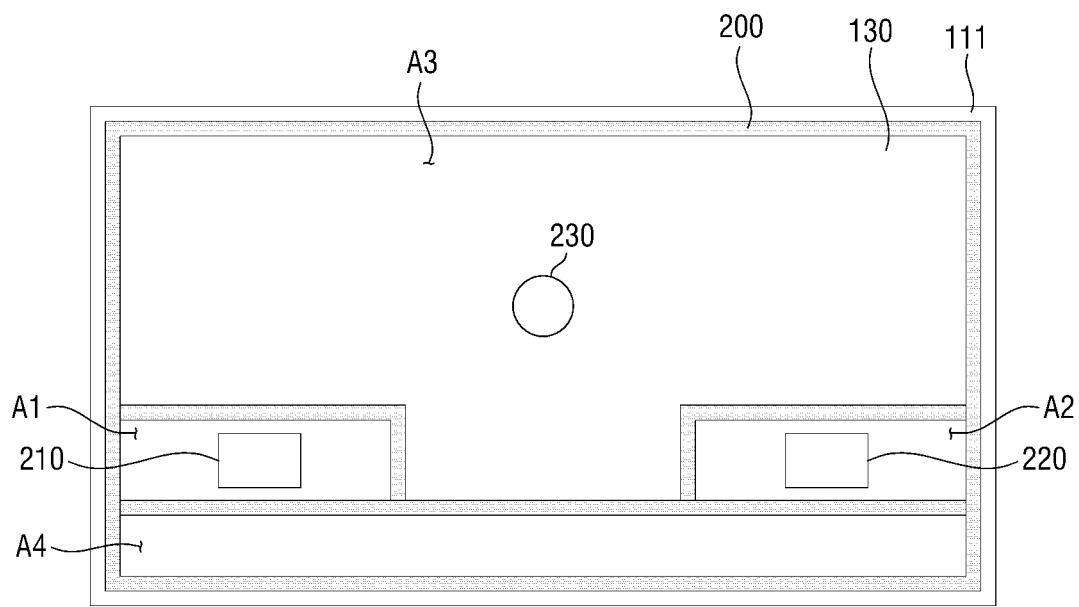
Figure 10:
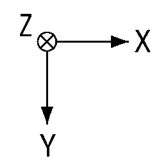

In addition, the surface of the heat dissipation film 130 may be divided into first through fourth areas A1 through A4 by the blocking member 200 as illustrated in FIG. 10.

Specifically, the arrangement of the first through third areas A1 through A3 may be the same as the arrangement in FIG. 9, but the fourth area A4 in which the source circuit boards 140 are disposed may be further disposed below the first through third areas A1 through A3. Due to the fourth area A4, the source circuit boards 140, the source driving circuits 121 and the flexible films 122 may be prevented from being affected by the first through third sound generators 210 through 230 of the first through third areas A1 through A3, or the effect may be reduced as described above.

FIG. 11 is a cross-sectional view of an exemplary embodiment of the display area of the display panel 110. Referring to FIG. 11, the display panel 110 (refer to FIG. 2) may include the first substrate 111, the second substrate 112 (refer to FIG. 2), the thin-film transistor layer TFTL, the light emitting element layer EML, the filler FL, the wavelength conversion layer QDL, and the color filter layer CFL.

A buffer layer 302 may be disposed on a surface of the first substrate 111 which faces the second substrate 112. The buffer layer 302 may be disposed on the first substrate 111 to protect thin-film transistors 335 and light emitting elements from moisture introduced through the first substrate 111 which is vulnerable to moisture penetration. The buffer layer 302 may include a plurality of inorganic layers stacked alternately. In an exemplary embodiment, the buffer layer 302 may be a multilayer in which one or more inorganic layers including at least one of a silicon oxide (SiOx) layer, a silicon nitride (SiNx) layer, and SiON are alternately stacked, for example. In another exemplary embodiment, the buffer layer 302 may be omitted.

The thin-film transistor layer TFTL is disposed on the buffer layer 302. The thin-film transistor layer TFTL includes the thin-film transistors 335, a gate insulating layer 336, an interlayer insulating film 337, a protective layer 338, and a planarization layer 339.

The thin-film transistors 335 are disposed on the buffer layer 302. Each of the thin-film transistors 335 includes an active layer 331, a gate electrode 332, a source electrode 333, and a drain electrode 334. In FIG. 11, each of the thin-film transistors 335 is provided as a top-gate type in which the gate electrode 332 is located above the active layer 331. However, it should be noted that the invention is not limited to this case. That is, each of the thin-film transistors 335 may also be provided as a bottom-gate type in which the gate electrode 332 is located under the active layer 331 or a double-gate type in which the gate electrode 332 is located both above and under the active layer 331.

The active layers 331 are disposed on the buffer layer 302. The active layers 331 may include a silicon-based semiconductor material or an oxide-based semiconductor material. A light shielding layer may be disposed between the buffer layer 302 and the active layers 331 to block external light from entering the active layers 331.

The gate insulating layer 336 may be disposed on the active layers 331. In an exemplary embodiment, the gate insulating layer 336 may be an inorganic layer, for example, a SiOx layer, a SiNx layer, or a multilayer including these layers.

The gate electrodes 332 and gate lines may be disposed on the gate insulating layer 336. Each of the gate electrodes 332 and the gate lines may be a single layer or a multilayer including any one or more of molybdenum (Mo), aluminum (Al), chromium (Cr), gold (Au), titanium (Ti), nickel (Ni), neodymium (Ne), copper (Cu), and alloys of the same, for example.

The interlayer insulating film 337 may be disposed on the gate electrodes 332 and the gate lines. In an exemplary embodiment, the interlayer insulating film 337 may be an inorganic layer, for example, a SiOx layer, a SiNx layer, or a multilayer including these layers, for example.

The source electrodes 333, the drain electrodes 334, and data lines may be disposed on the interlayer insulating film 337. Each of the source electrodes 333 and the drain electrodes 334 may be connected to an active layer 331 through a contact hole penetrating the gate insulating layer 336 and the interlayer insulating film 337. In an exemplary embodiment, each of the source electrodes 333, the drain electrodes 334 and the data lines may be a single layer or a multilayer including any one or more of molybdenum (Mo), aluminum (Al), chromium (Cr), gold (Au), titanium (Ti), nickel (Ni), neodymium (Ne), copper (Cu), and alloys of the same, for example.

The protective layer 338 for insulating the thin-film transistors 335 may be disposed on the source electrodes 333, the drain electrodes 334, and the data lines. In an exemplary embodiment, the protective layer 338 may be an inorganic layer, for example, a SiOx layer, a SiNx layer, or a multilayer including these layers.

The planarization layer 339 may be disposed on the protective layer 338 to planarize steps due to the thin-film transistors 335. In an exemplary embodiment, the planarization layer 339 may include an organic layer such as acryl resin, epoxy resin, phenolic resin, polyamide resin, or polyimide resin.

The light emitting element layer EML is disposed on the thin-film transistor layer TFTL. The light emitting element layer EML includes light emitting elements and a pixel defining layer 344.

The light emitting elements and the pixel defining layer 344 are disposed on the planarization layer 339. The light emitting elements may be organic light emitting devices. In this case, each of the light emitting elements may include an anode 341, a light emitting layer 342, and a cathode 343.

The anodes 341 may be disposed on the planarization layer 339. The anodes 341 may be connected to the drain electrodes 334 of the thin-film transistors 335 through contact holes penetrating the protective layer 338 and the planarization layer 339.

The pixel defining layer 344 may be disposed on the planarization layer 339 and may cover edges of the anodes 341 to define pixels. That is, the pixel defining layer 344 serves as a pixel defining layer for defining subpixels PX1 through PX3. Each of the subpixels PX1 through PX3 is an area in which the anode 341, the light emitting layer 342 and the cathode 343 are sequentially stacked so that holes from the anode 341 and electrons from the cathode 343 combine together in the light emitting layer 342 to emit light.

The light emitting layer 342 is disposed on each of the anodes 341 and the pixel defining layer 344. The light emitting layer 342 may be an organic light emitting layer. The light emitting layer 342 may emit light having a short wavelength, such as blue light or ultraviolet light. The blue light may have a peak wavelength range of about 450 nanometers (nm) to about 490 nm and the ultraviolet light may have a peak wavelength range of less than 450 nm. In this case, the light emitting layer 342 may be a common layer provided common to all of the subpixels PX1 through PX3. In this case, the display panel 110 may include the wavelength conversion layer QDL for converting short-wavelength light such as blue light or ultraviolet light emitted from the light emitting layer 342 into red light, green light and blue light and the color filter layer CFL which transmits each of the red light, green light and the blue light.

The light emitting layer 342 may include a hole transporting layer, a light emitting layer, and an electron transporting layer. In addition, the light emitting layer 342 may be provided in a tandem structure of two or more stacks, in which case a charge generating layer may be disposed between the stacks.

The cathode 343 is disposed on the light emitting layer 342. The cathode 343 may be provided to cover the light emitting layer 342. The cathode 343 may be a common layer provided common to all pixels.

The light emitting element layer EML may be provided as a top emission type which emits light toward the second substrate 112, that is, in an upward direction. In this case, the anodes 341 may include a metal material having high reflectivity, such as a stacked structure (Ti/Al/Ti) of Al and Ti, a stacked structure ("ITO/Al/ITO") of Al and indium tin oxide ("ITO"), an Ag—Pd—Cu ("APC") alloy or a stacked structure ("ITO/APC/ITO") of an APC alloy and ITO. The APC alloy is an alloy of Ag, palladium (Pd), and Cu. In addition, the cathode 343 may include a transparent conductive material ("TCO") capable of transmitting light, such as ITO or indium zinc oxide ("IZO"), or a semi-transmissive conductive material such as magnesium (Mg), Ag or an alloy of Mg and Ag. When the cathode 343 includes a semi-transmissive conductive material, the light output efficiency may be increased by a microcavity.

An encapsulation film 345 is disposed on the light emitting element layer EML. The encapsulation film 345 serves to prevent oxygen or moisture from permeating the light emitting layer 342 and the cathode 343. To this end, the encapsulation film 345 may include at least one inorganic layer. The inorganic layer may include silicon nitride, aluminum nitride, zirconium nitride, titanium nitride, hafnium nitride, tantalum nitride, silicon oxide, aluminum oxide, or titanium oxide. In addition, the encapsulation film 345 may further include at least one organic layer. The organic layer may be provided to a sufficient thickness to prevent particles from penetrating the encapsulation film 345 and entering the light emitting layer 342 and the cathode 343. In an exemplary embodiment, the organic layer may include any one of epoxy, acrylate, and urethane acrylate, for example.

The color filter layer CFL is disposed on a surface of the second substrate 112 which faces the first substrate 111. The color filter layer CFL may include a black matrix 360 and color filters 370.

The black matrix 360 may be disposed on the surface of the second substrate 112. The black matrix 360 may not overlap the subpixels PX1 through PX3 and may overlap the pixel defining layer 344. The black matrix 360 may include black dye capable of blocking light or an opaque metal material.

The color filters 370 may overlap the subpixels PX1 through PX3. A first color filter 371 may overlap a first subpixel PX1, a second color filter 372 may overlap a second subpixel PX2, and a third color filter 373 may overlap a third subpixel PX3. In this case, the first color filter 371 may be a first color light transmitting filter that transmits light of a first color, the second color filter 372 may be a second color light transmitting filter that transmits light of a second color, and the third color filter 373 may be a third color light transmitting filter that transmits light of a third color. In an exemplary embodiment, the first color may be red, the second color may be green, and the third color may be blue, for example. In this case, the peak wavelength range of red light transmitted through the first color filter 371 may be about 620 nm to about 750 nm, the peak wavelength range of green light transmitted through the second color filter 372 may be about 500 nm to about 570 nm, and the peak wavelength range of blue light transmitted through the third color filter 373 may be about 450 nm to about 490 nm, for example.

In addition, edges of two adjacent color filters may overlap the black matrix 360. Therefore, the black matrix 360 may prevent color mixing that occurs when light emitted from the light emitting layer 342 of any one subpixel travels to a color filter of an adjacent subpixel.

An overcoat layer may be disposed on the color filters 370 to planarize steps due to the color filters 370 and the black matrix 360. In another exemplary embodiment, the overcoat layer may be omitted.

The wavelength conversion layer QDL is disposed on the color filter layer CFL. The wavelength conversion layer QDL may include a first capping layer 351, a first wavelength conversion layer 352, a second wavelength conversion layer 353, a third wavelength conversion layer 354, a second capping layer 355, an interlayer organic film 356, and a third capping layer 357.

The first capping layer 351 may be disposed on the color filter layer CFL. The first capping layer 351 may prevent moisture or oxygen from permeating into the first wavelength conversion layer 352, the second wavelength conversion layer 353 and the third wavelength conversion layer 354 from the outside through the color filter layer CFL. In an exemplary embodiment, the first capping layer 351 may include an inorganic layer such as silicon nitride, aluminum nitride, zirconium nitride, titanium nitride, hafnium nitride, tantalum nitride, silicon oxide, aluminum oxide, or titanium oxide.

The first wavelength conversion layer 352, the second wavelength conversion layer 353 and the third wavelength conversion layer 354 may be disposed on the first capping layer 351.

The first wavelength conversion layer 352 may overlap the first subpixel PX1. The first wavelength conversion layer 352 may convert short-wavelength light such as blue light or ultraviolet light emitted from the light emitting layer 342 of the first subpixel PX1 into light of the first color. To this end, the first wavelength conversion layer 352 may include a first base resin, a first wavelength shifter, and a first scatterer.

The first base resin may be a material having high light transmittance and superior dispersion characteristics for the first wavelength shifter and the first scatterer. In an exemplary embodiment, the first base resin may include an organic material such as epoxy resin, acrylic resin, cardo resin, or imide resin, for example.

The first wavelength shifter may convert or shift the wavelength range of incident light. In an exemplary embodiment, the first wavelength shifter may be quantum dots, a quantum rod, or a phosphor, for example. In an exemplary embodiment, when the first wavelength shifter is quantum dots, it may be a semiconductor nanocrystalline material and may have a specific band gap according to its composition and size. Thus, the first wavelength shifter may absorb incident light and then emit light having a unique wavelength, for example. In addition the first wavelength shifter may have a core-shell structure including a core including a nanocrystal and a shell surrounding the core. In this case, examples of the nanocrystal that forms the core include a group IV nanocrystal, a group II-VI compound nanocrystal, a group III-V compound nanocrystal, a group IV-VI nanocrystal, and any combinations of the same. The shell may serve as a protective layer for maintaining semiconductor characteristics by preventing chemical denaturation of the core and/or as a charging layer for giving electrophoretic characteristics to the quantum dot. In addition, the shell may be a single layer or a multilayer. The shell may be, for example, a metal or non-metal oxide, a semiconductor compound, or any combination of the same.

The first scatterer may have a refractive index different from that of the first base resin and may form an optical interface with the first base resin. In an exemplary embodiment, the first scatterer may be light scattering particles, for example. In an exemplary embodiment, the first scatterer may be metal oxide particles such as titanium oxide ($TiO_2$), silicon oxide ($SiO_2$), zirconium oxide ($ZrO_2$), aluminum oxide ($Al_2O_3$), indium oxide ($In_2O_3$), zinc oxide (ZnO), or tin oxide ($SnO_2$), for example. In an alternative exemplary embodiment, the first scatterer may be organic particles such as acrylic resin or urethane resin.

The first scatterer may scatter incident light in random directions without substantially changing the wavelength of the light transmitted through the first wavelength conversion layer 352. Accordingly, this may increase the length of the path of the light transmitted through the first wavelength conversion layer 352, thereby increasing the color conversion efficiency of the first wavelength shifter.

In addition, the first wavelength conversion layer 352 may overlap the first color filter 371. Therefore, a portion of short-wavelength light such as blue light or ultraviolet light provided from the first subpixel PX1 may pass through the first wavelength conversion layer 352 as it is without being converted into light of the first color by the first wavelength shifter. However, the short-wavelength light such as blue light or ultraviolet light incident on the first color filter 371 without being converted by the first wavelength conversion layer 352 cannot pass through the first color filter 371. Light of the first color output from the first wavelength conversion layer 352 may pass through the first color filter 371 and proceed toward the second substrate 112.

The second wavelength conversion layer 353 may overlap the second subpixel PX2. The second wavelength conversion layer 353 may convert short-wavelength light such as blue light or ultraviolet light emitted from the light emitting layer 342 of the second subpixel PX2 into light of the second color. To this end, the second wavelength conversion layer 353 may include a second base resin, a second wavelength shifter, and a second scatterer. The second base resin, the second wavelength shifter and the second scatterer of the second wavelength conversion layer 353 are substantially the same as those of the first wavelength conversion layer 352, and thus a detailed description thereof is omitted. When the first wavelength shifter and the second wavelength shifter are quantum dots, the diameter of the second wavelength shifter may be smaller than that of the first wavelength shifter.

In addition, the second wavelength conversion layer 353 may overlap the second color filter 372. Therefore, a portion of short-wavelength light such as blue light or ultraviolet light provided from the second subpixel PX2 may pass through the second wavelength conversion layer 353 as it is without being converted into light of the second color by the second wavelength shifter. However, the short-wavelength light such as blue light or ultraviolet light incident on the second color filter 372 without being converted by the second wavelength conversion layer 353 cannot pass through the second color filter 372. Light of the second color output from the second wavelength conversion layer 353 may pass through the second color filter 372 and proceed toward the second substrate 112.

The third wavelength conversion layer 354 may overlap the third subpixel PX3. The third wavelength conversion layer 354 may convert short-wavelength light such as blue light or ultraviolet light emitted from the light emitting layer 342 of the third subpixel PX3 into light of the third color. To this end, the third wavelength conversion layer 354 may include a third base resin and a third scatterer. The third base resin and the third scatterer of the third wavelength conversion layer 354 are substantially the same as those of the first wavelength conversion layer 352, and thus a detailed description thereof is omitted.

In addition, the third wavelength conversion layer 354 may overlap the third color filter 373. Therefore, short-wavelength light such as blue light or ultraviolet light provided from the third subpixel PX3 may pass through the third wavelength conversion layer 354 as it is, and the light that passes through the third wavelength conversion layer 354 may pass through the third color filter 373 and proceed toward the second substrate 112.

The second capping layer 355 may be disposed on the first wavelength conversion layer 352, the second wavelength conversion layer 353, the third wavelength conversion layer 354, and the first capping layer 351 not covered by the wavelength conversion layers 352 through 354. The second capping layer 355 prevents moisture or oxygen from permeating into the first wavelength conversion layer 352, the second wavelength conversion layer 353 and the third wavelength conversion layer 354 from the outside. In an exemplary embodiment, the second capping layer 355 may include an inorganic layer such as silicon nitride, aluminum nitride, zirconium nitride, titanium nitride, hafnium nitride, tantalum nitride, silicon oxide, aluminum oxide, or titanium oxide.

The interlayer organic film 356 may be disposed on the second capping layer 355. The interlayer organic film 356 may be a planarization layer for planarizing steps due to the wavelength conversion layers 352 through 354. In an exemplary embodiment, the interlayer organic film 356 may include an organic layer such as acryl resin, epoxy resin, phenolic resin, polyamide resin, or polyimide resin.

The third capping layer 357 may be disposed on the interlayer organic film 356. In an exemplary embodiment, the third capping layer 357 may include an inorganic layer such as silicon nitride, aluminum nitride, zirconium nitride, titanium nitride, hafnium nitride, tantalum nitride, silicon oxide, aluminum oxide, or titanium oxide.

The filler FL may be disposed between the encapsulation film 345 disposed on the first substrate 111 and the third capping layer 357 disposed on the second substrate 112. The filler FL may include a material having a buffer function. In an exemplary embodiment, the filler FL may include an organic layer such as acryl resin, epoxy resin, phenolic resin, polyamide resin, or polyimide resin, for example.

In addition, a sealing material for bonding the first substrate 111 and the second substrate 112 may be disposed in the non-display area of the display panel 110. When seen in a plan view, the filler FL may be surrounded by the sealing material. The sealing material may be glass frit or a sealant.

In the exemplary embodiment of FIG. 11, the first through third subpixels PX1 through PX3 may emit short-wavelength light such as blue light or ultraviolet light. Light of the first subpixel PX1 is converted into light of the first color by the first wavelength conversion layer 352 and then output through the first color filter 371. Light of the second subpixel PX2 is converted into light of the second color by the second wavelength conversion layer 353 and then output through the second color filter 372. Light of the third subpixel PX3 is output through the third wavelength conversion layer 354 and the third color filter 373. Therefore, white light may be output.

In addition, in the exemplary embodiment of FIG. 11, each of the subpixels PX1 through PX3 is provided as a top emission type which emits light toward the second substrate 112, that is, in the upward direction. Therefore, the heat dissipation film 130 including an opaque material such as graphite or aluminum may be disposed on the surface of the first substrate 111.

The above-described sound generators will now be described in more detail.

The display device 10 in the exemplary embodiment may include three sound generators 210 through 230.

Figure 14:
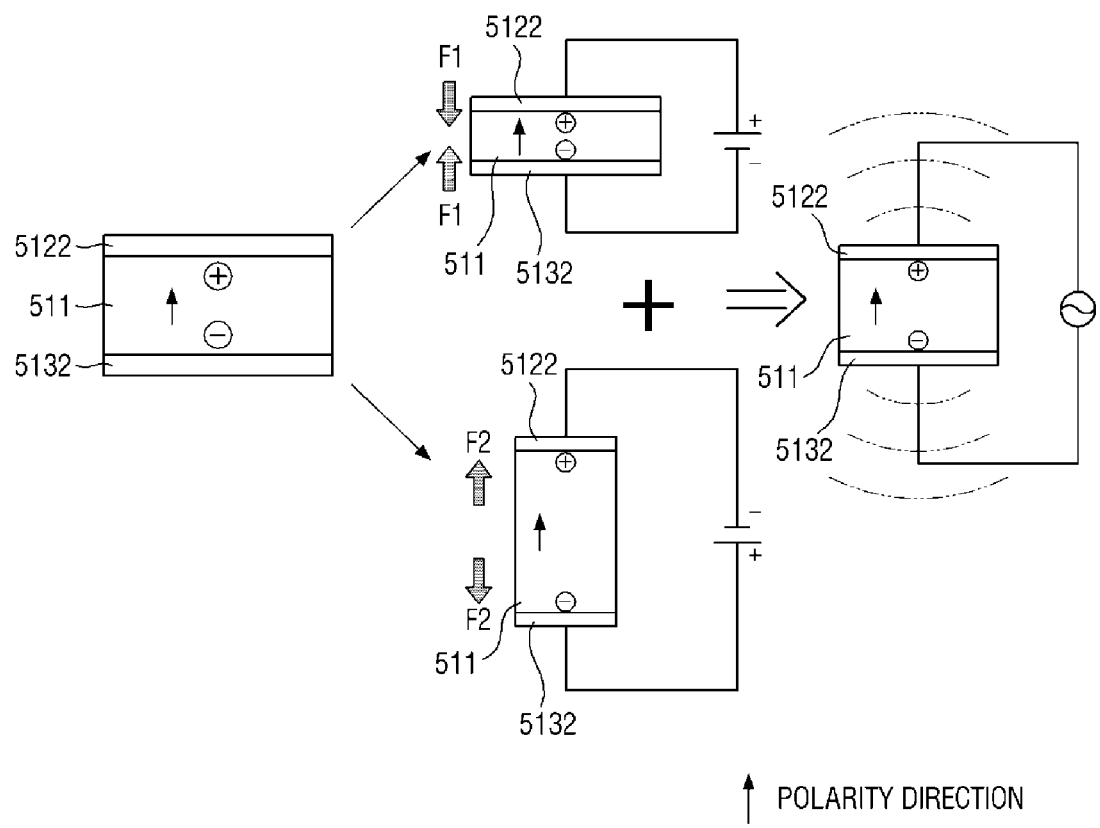
FIG. 14 illustrates an exemplary embodiment of a method of vibrating each of the first sound generator and the second sound generator.
Figure 15:
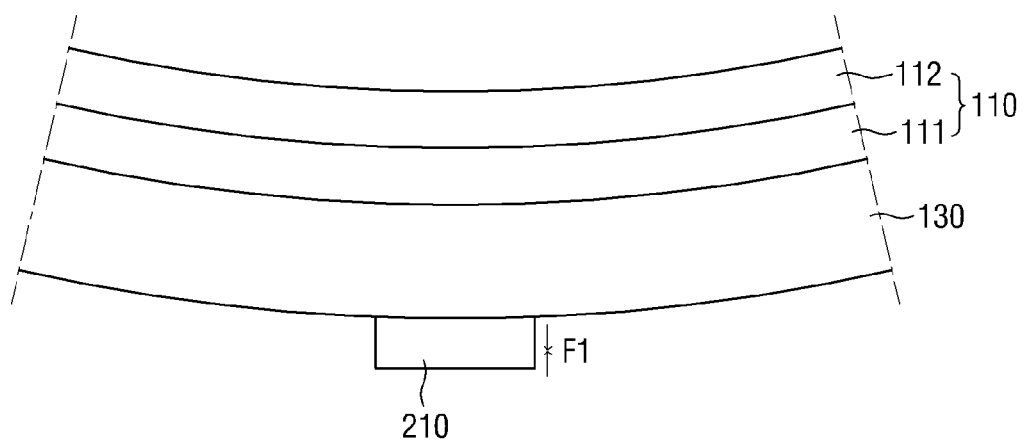
FIGS. 15 and 16 illustrate an exemplary embodiment of a case where the display panel is vibrated by the vibration of each of the first sound generator and the second sound generator.
Figure 15:
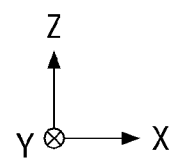
Figure 16:
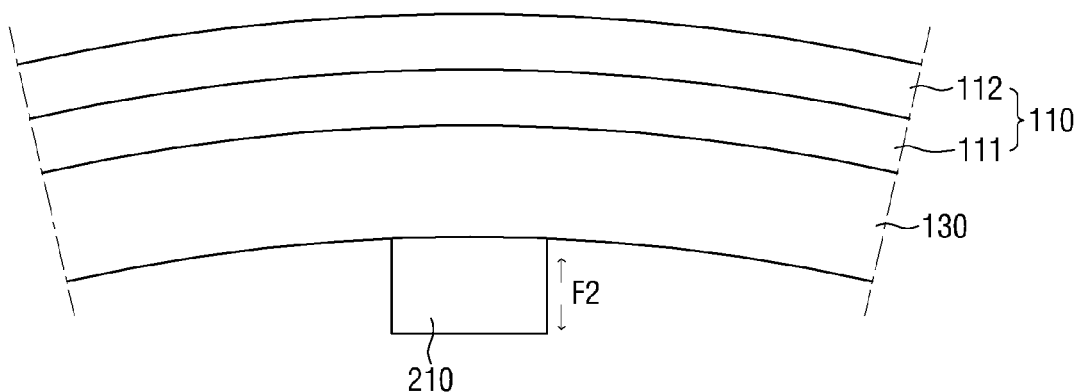

FIG. 12 is a perspective view of an exemplary embodiment of the first sound generator 210 and the second sound generator 220. FIG. 13 is a cross-sectional view taken along line XIII-XIII' of FIG. 12. FIG. 14 illustrates an exemplary embodiment of a method of vibrating each of the first sound generator 210 and the second sound generator 220. FIGS. 15 and 16 illustrate an exemplary embodiment of a case where the display panel 110 is vibrated by the vibration of each of the first sound generator 210 and the second sound generator 220.

Referring to FIGS. 12 through 16, each of the first sound generator 210 and the second sound generator 220 in the exemplary embodiment may be a piezoelectric element that vibrates the display panel 110 by contracting or expanding according to an applied voltage as illustrated in FIGS. 12 through 16. In this case, each of the first sound generator 210 and the second sound generator 220 may include a vibration layer 511, a first electrode 512, a second electrode 513, a first pad electrode, and a second pad electrode.

The first electrode 512 may include a first stem electrode 5121 and first branch electrodes 5122. The first stem electrode 5121 may be disposed on only one side surface of the vibration layer 511 or on a plurality of side surfaces of the vibration layer 511. The first stem electrode 5121 may also be disposed on an upper surface of the vibration layer 511. The first branch electrodes 5122 may branch from the first stem electrode 5121. The first branch electrodes 5122 may be arranged parallel to each other.

The second electrode 513 may include a second stem electrode 5131 and second branch electrodes 5132. The second stem electrode 5131 may be disposed on another side surface of the vibration layer 511 or on a plurality of side surfaces of the vibration layer 511. In this case, the first stem electrode 5121 may be disposed on any one of the side surfaces on which the second stem electrode 5131 is disposed. The second stem electrode 5131 may be disposed on the upper surface of the vibration layer 511. The first stem electrode 5121 and the second stem electrode 5131 may not overlap each other. The second branch electrodes 5132 may branch from the second stem electrode 5131. The second branch electrodes 5132 may be arranged parallel to each other.

The first branch electrodes 5122 and the second branch electrodes 5132 may be arranged parallel to each other in a horizontal direction (X-axis direction or Y-axis direction). In addition, the first branch electrodes 5122 and the second branch electrodes 5132 may be alternately arranged in a vertical direction (Z-axis direction). That is, the first branch electrodes 5122 and the second branch electrodes 5132 may be repeatedly arranged in the vertical direction (Z-axis direction) in the order of the first branch electrode 5122, the second branch electrode 5132, the first branch electrode 5122, and the second branch electrode 5132.

The first electrode 512 and the second electrode 513 may be connected to metal lines or pad electrodes of the first sound circuit board 250 (refer to FIG. 4) or the second sound circuit board 260 (refer to FIG. 4). The metal lines or pad electrodes of the first sound circuit board 250 or the second sound circuit board 260 may be connected to the first electrode 512 and the second electrode 513 disposed on the surface of the first sound generator 210 (refer to FIG. 4) or the second sound generator 220 (refer to FIG. 4).

The vibration layer 511 may be a piezoelectric element that is deformed according to a first driving voltage applied to the first electrode 512 and a second driving voltage applied to the second electrode 513. In this case, the vibration layer 511 may be any one of a piezoelectric material, such as a polyvinylidene fluoride ("PVDF") film or plumbum ziconate titanate ("PZT"), and an electroactive polymer.

Since the production temperature of the vibration layer 511 is high, the first electrode 512 and the second electrode 513 may include silver (Ag) having a high melting point or an alloy of Ag and palladium (Pd). When the first electrode 512 and the second electrode 513 include an alloy of Ag and Pd, the Ag content may be higher than the Pd content in order to increase the melting points of the first electrode 512 and the second electrode 513.

The vibration layer 511 may be disposed between each pair of the first and second branch electrodes 5122 and 5132. The vibration layer 511 may contract or expand according to a difference between the first driving voltage applied to each first branch electrode 5122 and the second driving voltage applied to a corresponding second branch electrode 5132.

Specifically, as illustrated in FIG. 13, the polarity direction of the vibration layer 511 disposed between a first branch electrode 5122 and a second branch electrode 5132 disposed under the first branch electrode 5122 may be an upward direction (↑). In this case, the vibration layer 511 has a positive polarity in an upper area adjacent to the first branch electrode 5122 and a negative polarity in a lower area adjacent to the second branch electrode 5132. In addition, the polarity direction of the vibration layer 511 disposed between a second branch electrode 5132 and a first branch electrode 5122 disposed under the second branch electrode 5132 may be a downward direction (↓). In this case, the vibration layer 511 has a negative polarity in an upper area adjacent to the second branch electrode 5132 and a positive polarity in a lower area adjacent to the first branch electrode 5122. The polarity direction of the vibration layer 511 may be determined by a poling process of applying an electric field to the vibration layer 511 using a first branch electrode 5122 and a second branch electrode 5132.

Referring to FIG. 14, when the polarity direction of the vibration layer 511 disposed between a first branch electrode 5122 and a second branch electrode 5132 disposed under the first branch electrode 5122 is the upward direction (↑), when the $(1A)^{th}$ driving voltage or the $(2A)^{th}$ driving voltage of the positive polarity is applied to the first branch electrode 5122 and the $(1B)^{th}$ driving voltage or the $(2B)^{th}$ driving voltage of the negative polarity is applied to the second branch electrode 5132, the vibration layer 511 may contract according to a first force F1. The first force F1 may be a compressive force. Also, when the $(1A)^{th}$ driving voltage or the $(2A)^{th}$ driving voltage of the negative polarity is applied to the first branch electrode 5122 and the $(1B)^{th}$ driving voltage or the $(2B)^{th}$ driving voltage of the positive polarity is applied to the second branch electrode 5132, the vibration layer 511 may expand according to a second force F2. The second force F2 may be a tensile force.

In addition, when the polarity direction of the vibration layer 511 disposed between a second branch electrode 5132 and a first branch electrode 5122 disposed under the second branch electrode 5132 is the downward direction (↓), when the $(1A)^{th}$ driving voltage or the $(2A)^{th}$ driving voltage of the positive polarity is applied to the second branch electrode 5132 and the $(1B)^{th}$ driving voltage or the $(2B)^{th}$ driving voltage of the negative polarity is applied to the first branch electrode 5122, the vibration layer 511 may expand according to a tensile force. Also, when the $(1A)^{th}$ driving voltage or the $(2A)^{th}$ driving voltage of the negative polarity is applied to the second branch electrode 5132 and the $(1B)^{th}$ driving voltage or the $(2B)^{th}$ driving voltage of the positive polarity is applied to the first branch electrode 5122, the vibration layer 511 may contract according to a compressive force.

In the exemplary embodiment illustrated in FIGS. 12 and 13, when the $(1A)^{th}$ driving voltage or the $(2A)^{th}$ driving voltage applied to the first electrode 512 and the $(1B)^{th}$ driving voltage or the $(2B)^{th}$ driving voltage applied to the second electrode 513 repeatedly alternate between the positive polarity and the negative polarity, the vibration layer 511 may repeatedly contact and expand, thus causing each of the first sound generator 210 and the second sound generator 220 to vibrate.

Since each of the first sound generator 210 and the second sound generator 220 is disposed on the lower surface of the display panel 110, when the vibration layer 511 of each of the first sound generator 210 and the second sound generator 220 contracts and expands, the display panel 110 may vibrate up and down due to stress, as illustrated in FIGS. 15 and 16. That is, since the display panel 110 is vibrated by each of the first sound generator 210 and the second sound generator 220, the display device 10 may output a sound.

FIG. 17 is a cross-sectional view taken along line XVII-XVII' of FIG. 3. FIGS. 18 and 19 illustrate an exemplary embodiment of a case where the display panel 110 is vibrated by the vibration of the third sound generator 230.

The third sound generator 230 may be an exciter that vibrates the display panel 110 by generating a magnetic force using a voice coil as illustrated in FIGS. 17 through 19 or may be an LRA or an ERM that vibrates the display panel 110 by generating a magnetic force using a voice coil.

When the third sound generator 230 is an exciter, it may include a magnet 211, a bobbin 212, a voice coil 213, a damper 214, and a lower plate 215.

The magnet 211 is a permanent magnet, and a sintered magnet such as barium ferrite may be used. In an exemplary embodiment, the material of the magnet 211 may be, but is not limited to, ferric trioxide ($Fe_2O_3$), barium carbonate ($BaCO_3$), a neodymium magnet, strontium ferrite with an improved magnetic component, or an aluminum (Al), nickel (Ni) or cobalt (Co) alloy cast magnet, for example. In an exemplary embodiment, the neodymium magnet may be, for example, neodymium-iron-boron (Nd—Fe—B), for example.

The magnet 211 may include a plate 211*a*, a central protrusion 211*b* protruding from a center of the plate 211*a*, and sidewalls 211*c* protruding from edges of the plate 211*a*. The central protrusion 211*b* and the sidewalls 211*c* may be spaced apart from each other by a predetermined distance. Therefore, a predetermined space may be defined between the central protrusion 211*b* and each of the sidewalls 211*c*. That is, the magnet 211 may be shaped like a circular cylinder, specifically, a circular cylinder having a circular space defined in any one base of the circular cylinder. The lower set cover 102 illustrated in FIG. 2 may be fixed to the plate 211*a* of the magnet 211.

The central protrusion 211*b* of the magnet 211 may have the magnetism of a north (N) pole, and the plate 211*a* and the sidewalls 211*c* may have the magnetism of a south (S) pole. Therefore, an external magnetic field may be generated between the central protrusion 211*b* and the plate 211*a* of the magnet 211 and between the central protrusion 211*b* and the sidewalls 211*c*.

The bobbin 212 may be cylindrical. The central protrusion 211*b* of the magnet 211 may be disposed inside the bobbin 212. That is, the bobbin 212 may surround the central protrusion 211*b* of the magnet 211. In addition, the sidewalls 211*c* of the magnet 211 may be disposed outside the bobbin 212. That is, the sidewalls 211*c* of the magnet 211 may surround the bobbin 212. A space may be defined between the bobbin 212 and the central protrusion 211*b* of the magnet 211 and between the bobbin 212 and the sidewalls 211*c* of the magnet 211.

The bobbin 212 may include a material obtained by processing pulp or paper, aluminum or magnesium or an alloy of the same, a synthetic resin such as polypropylene, or a polyamide-based fiber. An end of the bobbin 212 may be attached to the heat dissipation film 130 using an adhesive member. In an exemplary embodiment, the adhesive member may be a double-sided tape, for example.

The voice coil 213 is wound on an outer circumferential surface of the bobbin 212. An end of the voice coil 213 which is adjacent to the end of the bobbin 212 may receive the $(3A)^{th}$ driving voltage, and the other end of the voice coil 213 which is adjacent to the other end of the bobbin 212 may receive the $(3B)^{th}$ driving voltage. Therefore, an electric current may flow through the voice coil 213 according to the $(3A)^{th}$ driving voltage and the $(3B)^{th}$ driving voltage. An applied magnetic field may be generated around the voice coil 213 according to the electric current flowing through the voice coil 213. The direction of the electric current flowing through the voice coil 213 may be opposite when the $(3A)^{th}$ driving voltage is a positive voltage and the $(3B)^{th}$ driving voltage is a negative voltage and when the $(3A)^{th}$ driving voltage is a negative voltage and the $(3B)^{th}$ driving voltage is a positive voltage. Therefore, the N pole and the S pole of the applied magnetic field generated around the voice coil 213 may be changed according to the alternating current ("AC") driving of the $(3A)^{th}$ driving voltage and the $(3B)^{th}$ driving voltage. Accordingly, an attractive force and a repulsive force alternately act on the magnet 211 and the voice coil 213. Therefore, the bobbin 212 on which the voice coil 213 is wound may reciprocate in the third direction (Z-axis direction) as illustrated in FIGS. 18 and 19. Accordingly, the display panel 110 and the heat dissipation film 130 vibrate in the third direction (Z-axis direction), thereby outputting sound.

The damper 214 is disposed between a portion of an upper side of the bobbin 212 and the protrusions 211*c* of the magnet 211. The damper 213 adjusts the up and down vibration of the bobbin 212 by contacting or relaxing according to the up and down movement of the bobbin 212. That is, since the damper 214 is connected to the bobbin 212 and the protrusions 211*c* of the magnet 211, the up and down movement of the bobbin 212 may be limited by a restoring force of the damper 214. In an exemplary embodiment, when the bobbin 212 vibrates above a predetermined height or vibrates below a predetermined height, it may be returned to its original position by the restoring force of the damper 214, for example.

The lower plate 215 may be disposed on a lower surface of the magnet 211. The lower plate 215 may be unitary with the magnet 211 or may be provided separately from the magnet 211. When the lower plate 215 is provided separately from the magnet 211, the magnet 211 may be attached to the lower plate 215 with an adhesive member such as a double-sided tape.

The lower plate 215 may be fixed to the control circuit board 160 by fixing members 216 such as screws. Accordingly, the magnet 211 of each of the first sound generator 210 and the third sound generator 230 may be fixed to the control circuit board 160.

Although a case where the magnet 211 of the third sound generator 230 is fixed to the control circuit board 160 is described herein as an example, the invention is not limited to this case. That is, the magnet 211 of the third sound generator 230 may be fixed to the system circuit board, the power circuit board, or a dummy circuit board instead of the control circuit board 160. The dummy circuit board refers to a circuit board on which no circuit other than the third sound generator 230 is disposed. The dummy circuit board may be an FPCB or a PCB.

Each of the first sound generator 210 and the second sound generator 220 may function as a tweeter that outputs sound having a high sound pressure level in a high-frequency band. The third sound generator 230 may function as a woofer that outputs sound having a high sound pressure level in a low-frequency band. In an exemplary embodiment, the high-frequency band may be a frequency band of about 1 kilohertz (kHz) or more, and the lower-frequency band maybe a frequency band of about 800 Hertz (Hz) or less, for example.

In an exemplary embodiment, the first sound generator 210 may be disposed close to a right side of the display panel 110, and the second sound generator 220 may be disposed close to a left side of the display panel 110. Although the third sound generator 230 is disposed close to an upper side of the display panel 110 in FIGS. 1 through 4, the position of the third sound generator 230 is not limited to this position because the third sound generator 230 functions as a woofer having lower sound directivity than the tweeter. Therefore, a first sound is output forward from the right side of the display panel 110 by the first sound generator 210, a second sound is output forward from the left side of the display panel 110 by the second sound generator 220, and a third low-pitched sound is output by the third sound generator 230. Therefore, the display device 10 may provide 2.1-channel stereo sound to a user.

Figure 20:
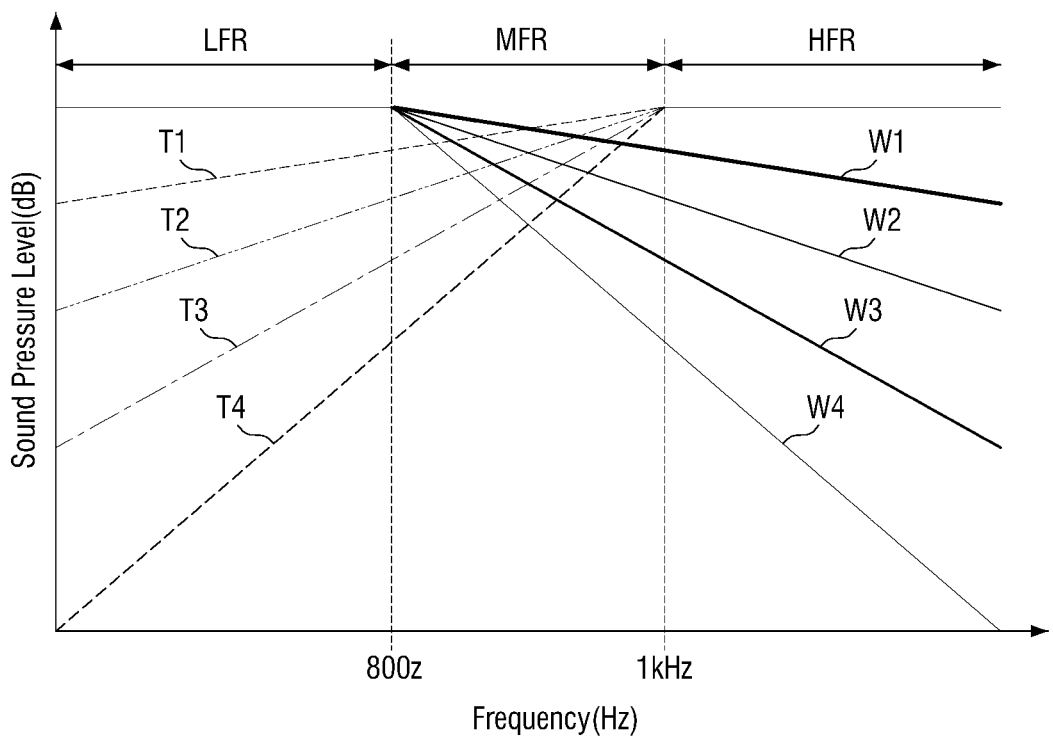
FIG. 20 illustrates an exemplary embodiment of the sound pressure level for each frequency of sound generated by a sound generator.

FIG. 20 illustrates an exemplary embodiment of the sound pressure level for each frequency of sound generated by a sound generator. Referring to FIG. 20, the X axis represents frequency (Hz), and the Y axis represents sound pressure level (dB).

In FIG. 20, each of W1, W2, W3 and W4 corresponds to a sound pressure level for each frequency of sound of a sound generator serving as a woofer. Fundamental 0 (F0) of each of W1, W2, W3 and W4 may be within a low-frequency region LFR. The F0 of each of W1, W2, W3 and W4 is about 800 Hz or less, preferably, about 400 Hz or less. Each of W1, W2, W3 and W4 may decrease with a predetermined slope in a mid-frequency region MFR and a high-frequency region HFR. An absolute value of the slope of W1, an absolute value of the slope of W2, an absolute value of the slope of W3, and an absolute value of the slope of W4 in the mid-frequency region MFR and the high-frequency region HFR may become larger from W1 toward W4. The sound of the sound generator serving as a woofer may be set to any one of W1, W2, W3 and W4 in view of the characteristics of the sound.

In FIG. 20, each of T1, T2, T3 and T4 corresponds to a sound pressure level for each frequency of sound of a sound generator serving as a tweeter. F0 of each of T1, T2, T3 and T4 may be within the high-frequency region HFR. The F0 of each of T1, T2, T3 and T4 may be about 1 kHz or more. Each of T1, T2, T3 and T4 may increase with a predetermined slope in the low-frequency region LFR and the mid-frequency region MFR. An absolute value of the slope of T1, an absolute value of the slope of T2, an absolute value of the slope of T3, and an absolute value of the slope of T4 in the low-frequency region LFR and the mid-frequency region MFR may become larger from T1 toward T4. The sound of the sound generator serving as a tweeter may be set to any one of T1, T2, T3 and T4 in view of the characteristics of the sound.

In an exemplary embodiment, the F0 of each of the first sound generator 210 and the second sound generator 220 may be about 1 kHz or more. F0 indicates a minimum frequency at which the vibration displacement of the display panel 110 exceeds a reference displacement due to a sound generator. When the vibration displacement of the display panel 110 exceeds the reference displacement due to the sound generator, the sound pressure level may exceed a reference sound pressure level. In an exemplary embodiment, the F0 of the third sound generator 230 may be about 800 Hz, preferably, about 400 Hz or less.

The output sound characteristics of the first sound generator 210 may be substantially the same as the output sound characteristics of the second sound generator 220. In an exemplary embodiment, the F0 of the first sound generator 210 and the F0 of the second sound generator 220 may be substantially the same, and the frequency versus sound pressure level of the first sound generator 210 and the frequency versus sound pressure level of the second sound generator 220 may be any one of T1, T2, T3 and T4, for example. Here, since the display device 10 includes the third sound generator 230 to output low-pitched sound, the frequency versus sound pressure level of the first sound generator 210 and the frequency versus sound pressure level of the second sound generator 220 may be T3 or T4 because they do not need to be high in the low-frequency region LFR. The frequency versus sound pressure level of the third sound generator 230 may be any one of W1, W2, W3 and W4 of FIG. 20.

In an alternative exemplary embodiment, the output sound characteristics of the first sound generator 210 and the output sound characteristics of the second sound generator 220 maybe different from each other. In an exemplary embodiment, the frequency versus sound pressure level of the first sound generator 210 and the frequency versus sound pressure level of the second sound generator 220 may be different from each other, for example. In another exemplary embodiment, the F0 of the first sound generator 210 may be different from the F0 of the second sound generator 220, for example.

The display device 10 in the exemplary embodiment outputs sound having a high sound pressure level in a high-frequency band by the first sound generator 210 and the second sound generator 220 and outputs sound having a low sound pressure level in a low-frequency band by the third sound generator 230. Therefore, the display device 10 may provide 2.1-channel stereo sound to a user.

Hereinafter, other exemplary embodiments will be described. In the following embodiments, the same elements as those of the above-described embodiment will be indicated by the same reference numerals, and a redundant description thereof will be omitted or given briefly.

Figure 21:
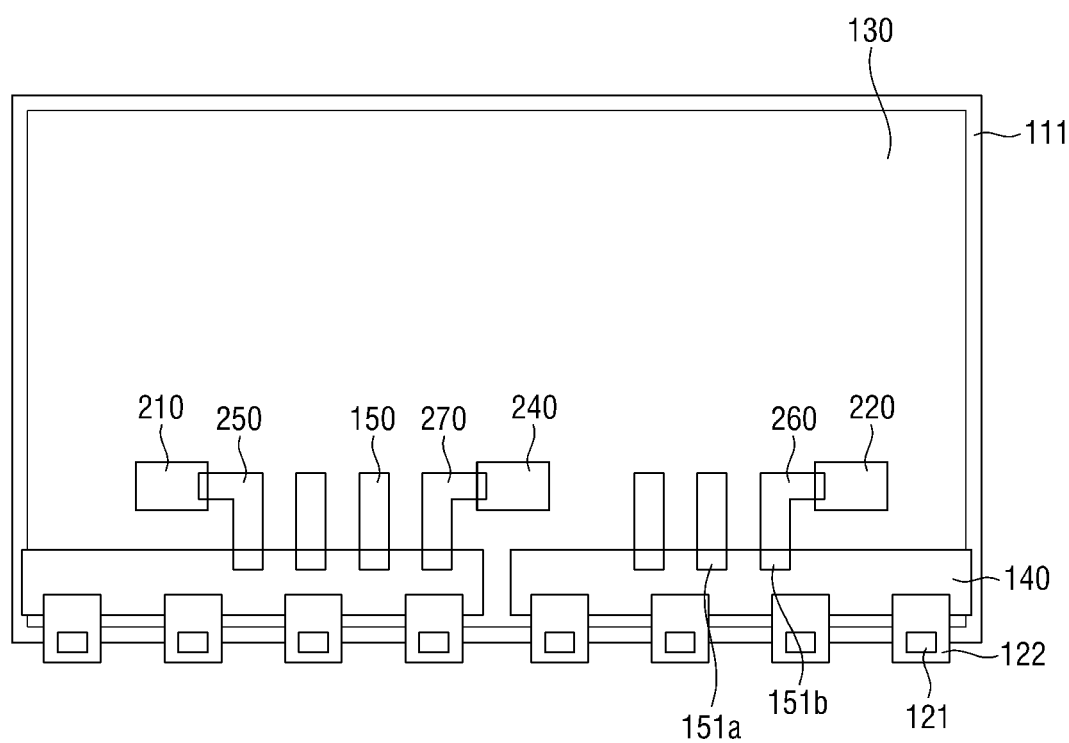
FIG. 21 is a bottom view of an exemplary embodiment of a display device.

FIG. 21 is a bottom view of an exemplary embodiment of a display device 10_1. Since FIG. 21 is a bottom view, it should be noted that left and right sides of the display device 10_1 are reversed as compared with those of FIGS. 1 and 2.

Referring to FIG. 21, the display device 10_1 according to the illustrated exemplary embodiment is different from the exemplary embodiment of FIGS. 1 through 4 in that it further includes a fourth sound generator 240 and the third sound circuit board 270.

The fourth sound generator 240 may be a piezoelectric element that vibrates a display panel 110 by contracting or expanding according to an applied voltage. In this case, the fourth sound generator 240 may function as a tweeter that outputs sound having a high sound pressure level in a high-frequency band.

A first sound generator 210 may be disposed close to a right side of the display panel 110, a second sound generator 220 may be disposed close to a left side of the display panel 110, and the fourth sound generator 240 may be disposed close to a center of the display panel 110. Therefore, a first sound is output forward from the right side of the display panel 110 by the first sound generator 210, a second sound is output forward from the left side of the display panel 110 by the second sound generator 220, a fourth sound is output forward from the center of the display panel 110 by the fourth sound generator 240, and a third low-pitched sound is output by a third sound generator 230. Therefore, the display device 10_1 may provide 3.1-channel stereo sound to a user.

In an exemplary embodiment, F0 of the fourth sound generator 240 may be about 1 kHz or more. The output sound characteristics of the fourth sound generator 240 may be substantially the same as the output sound characteristics of the first sound generator 210 and/or the output sound characteristics of the second sound generator 220. In an exemplary embodiment, the F0 of the first sound generator 210, the F0 of the second sound generator 220, and the F0 of the fourth sound generator 240 may be substantially the same, and the frequency versus sound pressure level of the first sound generator 210, the frequency versus sound pressure level of the second sound generator 220 and the frequency versus sound pressure level of the fourth sound generator 240 may be any one of T1, T2, T3 and T4 of FIG. 20, for example. Here, since the display device 10 includes the third sound generator 230 to output low-pitched sound, the frequency versus sound pressure level of the first sound generator 210, the frequency versus sound pressure level of the second sound generator 220 and the frequency versus sound pressure level of the fourth sound generator 240 may be T3 or T4 because they do not need to be high in the low-frequency region LFR.

In an alternative exemplary embodiment, the output sound characteristics of the first sound generator 210, the output sound characteristics of the second sound generator 220, and/or the output sound characteristics of the fourth sound generator 240 may be different. In an exemplary embodiment, the frequency versus sound pressure level of the first sound generator 210, the frequency versus sound pressure level of the second sound generator 220, and the frequency versus sound pressure level of the fourth sound generator 240 may be different, for example. In another exemplary embodiment, the F0 of the first sound generator 210, the F0 of the second sound generator 220, and the F0 of the fourth sound generator 240 may be different, for example.

The display device 10_1 according to the illustrated exemplary embodiment outputs sound having a high sound pressure level in a high-frequency band by the first sound generator 210, the second sound generator 220 and the fourth sound generator 240 and outputs sound having a low sound pressure level in a low-frequency band by the third sound generator 230. Therefore, the display device 10 may provide 3.1-channel stereo sound to a user.

Figure 22:
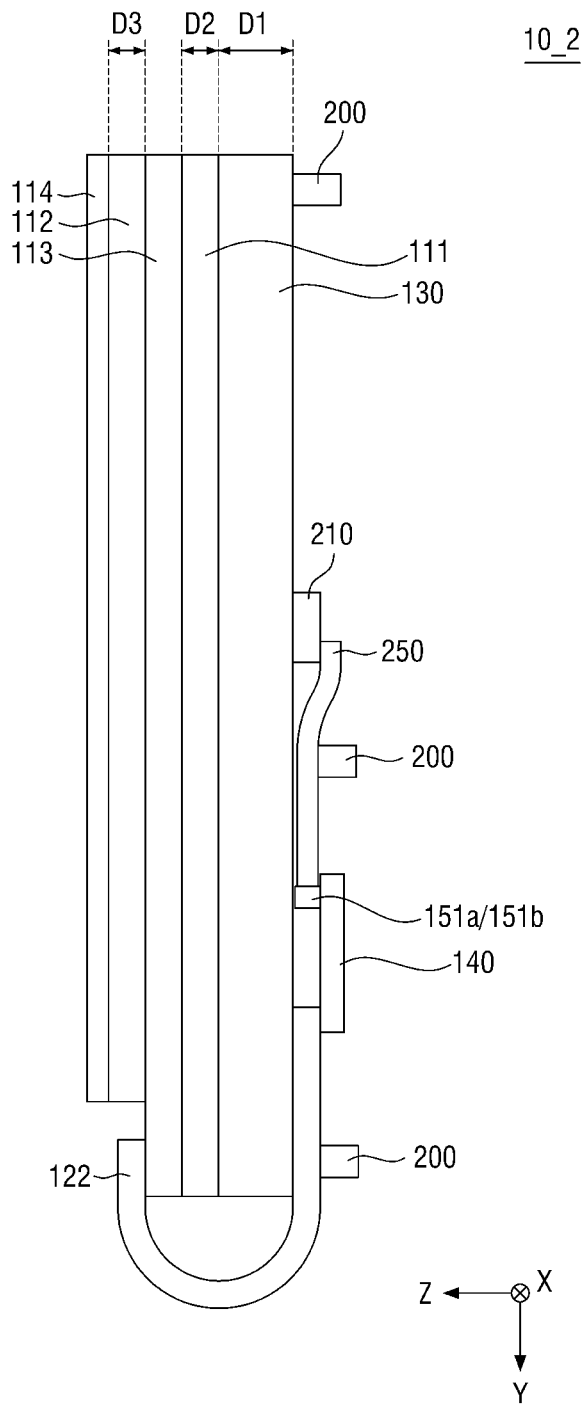
FIG. 22 is a cross-sectional view of an exemplary embodiment of a display device.

FIG. 22 is a cross-sectional view of an exemplary embodiment of a display device 10_2. FIG. 22 is a cross-sectional view taken along a position corresponding to VI-VI' of FIG. 4.

Referring to FIG. 22, the display device 10_2 according to the illustrated exemplary embodiment is different from the exemplary embodiment of FIG. 4 in that a blocking member 200 is disposed on a heat dissipation film 130 and a first sound circuit board 250.

Specifically, a first sound generator 210 and a source circuit board 140 may be connected by the first sound circuit board 250, and the blocking member 200 may be disposed on the heat dissipation film 130 and the first sound circuit board 250. In this case, a surface of the first sound circuit board 250 may contact the heat dissipation film 130, and the other surface of the first sound circuit board 250 may contact the blocking member 200. In addition, although not illustrated in the drawing, a surface of the blocking member 200 may contact the first sound circuit board 250, and the other surface of the blocking member 200 may contact a lower cover 180. In this case, an adhesive material may be further disposed between the first sound circuit board 250 and the blocking member 200 in order to more effectively block vibrations generated by an adjacent sound generator.

Although only the first sound circuit board 250 is illustrated in the drawing, the invention is not limited to this case, and the blocking member 200 may also be disposed on a second sound circuit board 260.

Figure 23:
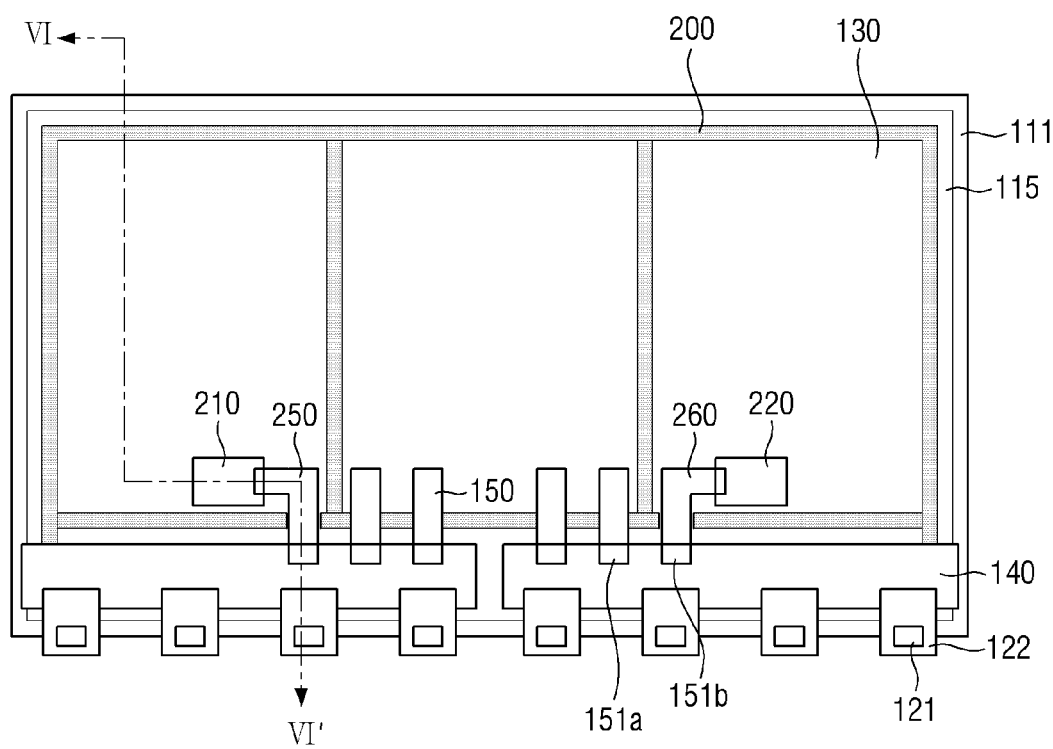
FIG. 23 is a bottom view of an exemplary embodiment of a display device.
Figure 24:
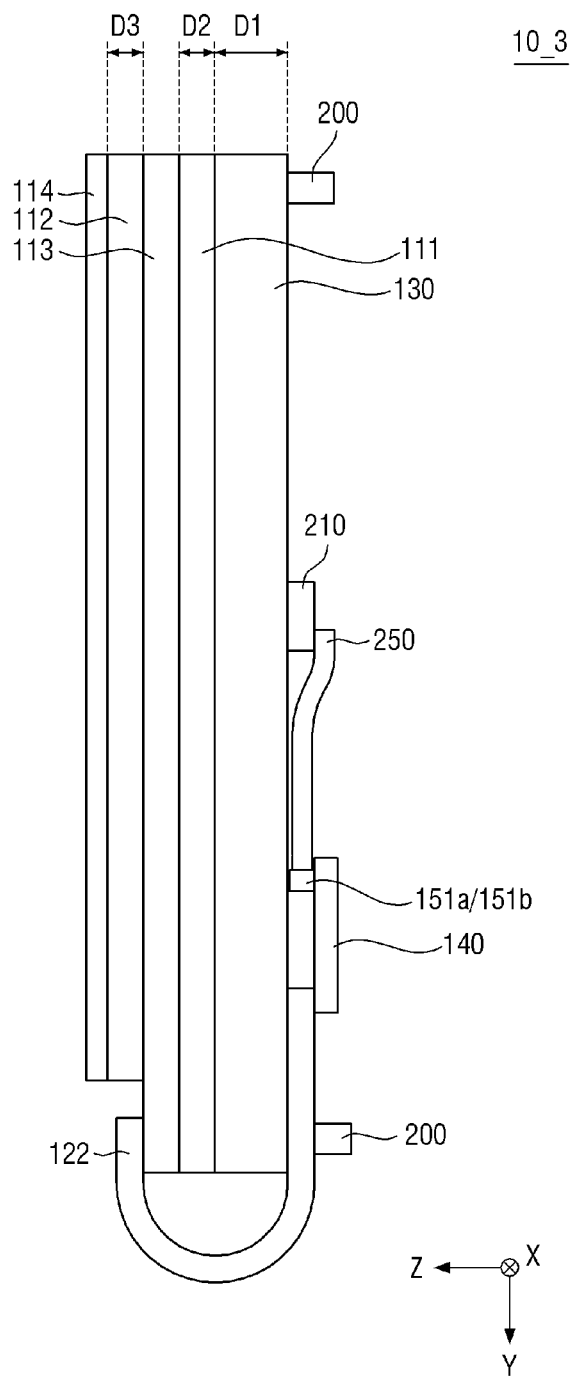
FIG. 24 is a cross-sectional view of the exemplary embodiment of the display device of FIG. 23.

FIG. 23 is a bottom view of an exemplary embodiment of a display device 10_3. FIG. 24 is a cross-sectional view of an exemplary embodiment of the display device 10_3. FIG. 23 is a bottom view of the display device 10_3 excluding a lower cover, a control circuit board, etc. FIG. 24 is a cross-sectional view taken along a position corresponding to VI-VI' of FIG. 4.

Referring to FIGS. 23 and 24, the display device 10_3 according to the illustrated exemplary embodiment is different from the exemplary embodiment of FIGS. 3 through 6 in that a blocking member 200 is not disposed on a first sound circuit board 250.

Specifically, a first sound generator 210 may be connected to a connector of a source circuit board 140 by the first sound circuit board 250. In this case, the blocking member 200 may be partially cut in an area in which the first sound circuit board 250 is disposed. Accordingly, the blocking member 200 may not overlap the first sound circuit board 250.

Figure 25:
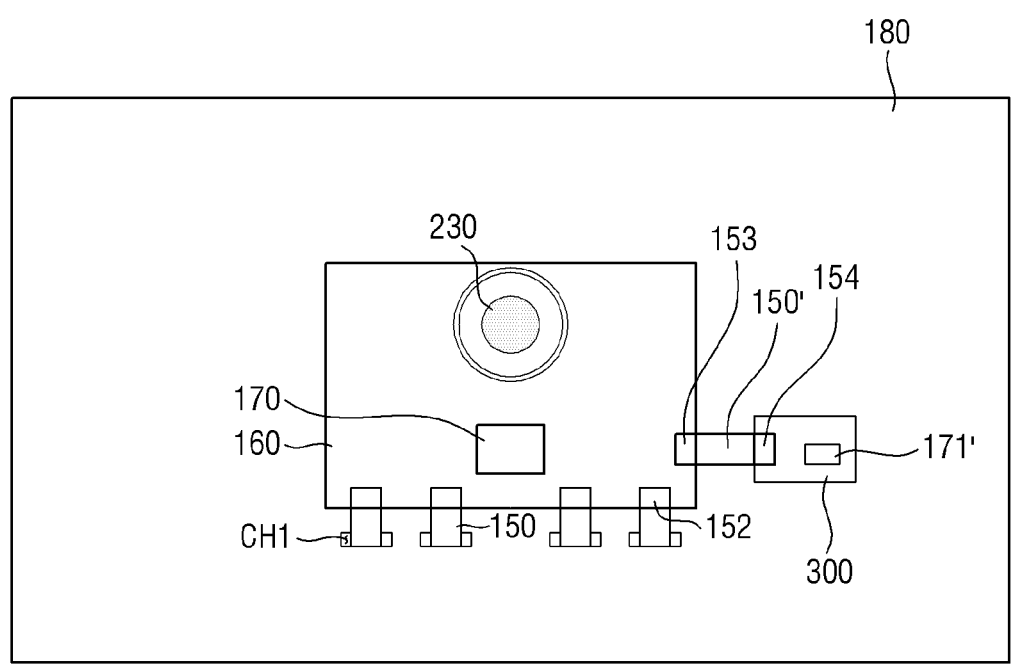
FIG. 25 is a bottom view of an exemplary embodiment of a display device.

FIG. 25 is a bottom view of an exemplary embodiment of a display device 10_4.

Referring to FIG. 25, the display device 10_4 according to the illustrated exemplary embodiment is different from the exemplary embodiment of FIG. 3 in that a sound driving circuit board 300 is further disposed on a lower cover 180. Specifically, the sound driving circuit board 300 may be connected to a control circuit board 160 via a cable 150'. To this end, the control circuit board 160 may include a third connector 153 for connection to the cable 150'. In addition, the sound driving circuit board 300 may include a fourth connector 154 for connection to the cable 150'.

The sound driving circuit board 300 may include a second sound driving circuit 171'. Specifically, the second sound driving circuit 171' may receive a sound control signal which is a digital signal from a system circuit board. The second sound driving circuit 171' may be provided as an IC and may include a DSP for processing a sound control signal which is a digital signal, a DAC for converting the digital signal processed by the DSP into driving voltage which are analog signal, an AMP for amplifying the analog driving voltage output from the DAC and outputting the amplified analog driving voltage, etc.

When the sound driving circuit board 300 is disposed on the lower cover 180 as illustrated in FIG. 25 and a first sound generator 210 and a second sound generator 220 are disposed on a surface of a heat dissipation film 130, a first sound signal of the second sound driving circuit 171' may be transmitted to the first sound generator 210 via cables 150 and 150', the control circuit board 160, a source circuit board 140 and a first sound circuit board 250. Also, a second sound signal of the second sound driving circuit 171' may be transmitted to the second sound generator 220 via the cables 150 and 150', the control circuit board 160, the source circuit board 140, and a second sound circuit board 260.

In addition, when the sound driving circuit board 300 is disposed on the lower cover 180 and a third sound generator 230 is disposed on the control circuit board 160, the sound driving circuit board 300 and the third sound generator 230 may be electrically connected by the cable 150' and metal lines of the control circuit board 160.

The second sound driving circuit 171' illustrated in FIG. 25 may be substantially the same as the sound driving circuit 171 illustrated in FIG. 3, and thus a detailed description thereof is omitted.

In the exemplary embodiment illustrated in FIG. 25, the first sound generator 210 and the source circuit board 140 are connected by the first sound circuit board 250, and the second sound generator 220 and the source circuit board 140 are connected by the second sound circuit board 260. Therefore, even when the sound driving circuit board 300 is disposed on the lower cover 180, the control circuit board 160 is disposed on a surface of the lower cover 180, and the first sound generator 210 and the second sound generator 220 are disposed on the surface of the heat dissipation film 130, the sound driving circuit board 300, the control circuit board 160 and the first sound generator 210 may be easily electrically connected to each other, and the sound driving circuit board 300, the control circuit board 160 and the second sound generator 220 may be easily electrically connected to each other.

An exemplary embodiment of a process of a display device will now be described. Elements substantially the same as those of FIGS. 1 through 6 will be indicated by the same reference numerals, and detailed reference numerals will be omitted.

Figure 26:
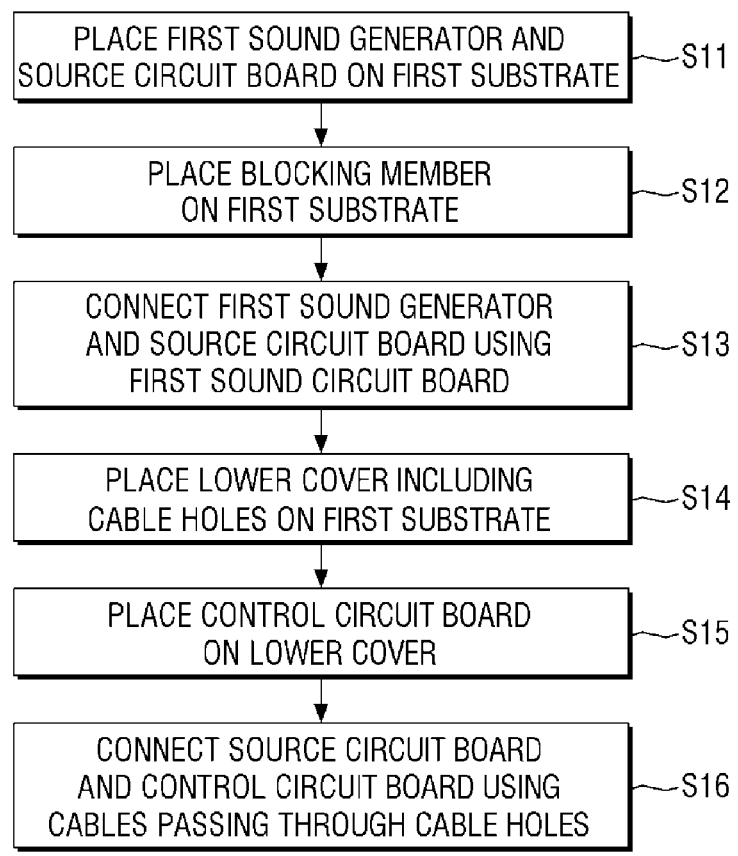
FIG. 26 is a flowchart illustrating an exemplary embodiment of a process of manufacturing a display device.

FIG. 26 is a flowchart illustrating an exemplary embodiment of a process of manufacturing a display device.

Referring to FIG. 26, the method of manufacturing a display device in the exemplary embodiment may include placing a first sound generator 210 and a source circuit board 140 on a first substrate 111 (operation S11), placing a blocking member 200 on the first substrate 111 (operation S12), connecting the first sound generator 210 and the source circuit board 140 using a first sound circuit board 250 (operation S13), placing a lower cover 180 including cable holes CH1 on the first substrate 111 (operation S14), placing a control circuit board 160 on the lower cover 180 (operation S15), and connecting the source circuit board 140 and the control circuit board 160 using cables 150 passing through the cable holes CH1 (operation S16).

Referring to FIGS. 26 and 1 through 6, first, the first sound generator 210 and the source circuit board 140 are placed on the first substrate 111 (operation S11). The first sound generator 210 and the source circuit board 140 may be attached onto a surface of the first substrate 111 by an adhesive member such as a double-sided adhesive.

Next, the blocking member 200 is placed on the first substrate 111 (operation S12). The blocking member 200 may also be attached onto the surface of the first substrate 111 by an adhesive member.

Next, the first sound generator 210 and the source circuit board 140 are connected using the first sound circuit board 250 (operation S13). Specifically, the first sound generator 210 may be connected to a $(1B)^{th}$ connector 151b of the source circuit board 140 by the first sound circuit board 250. A first pad and a second pad connected to a first electrode and a second electrode disposed on a surface of the first sound generator 210 may be disposed on a side of the first sound circuit board 250. A connection portion for connection to the $(1B)^{th}$ connector 151b of the source circuit board 140 may be disposed on the other side of the first sound circuit board 250. That is, the first sound generator 210 may be electrically connected to the source circuit board 140 by the first sound circuit board 250.

Next, the lower cover 180 including the cable holes CH1 is placed on the first substrate 111 (operation S14). The lower cover 180 may be attached to edges of the surface of the first substrate 111 of a display panel 110 by a first adhesive member 115. The first adhesive member 115 may be a double-sided tape including a buffer layer such as foam.

Next, the control circuit board 160 is placed on the lower cover 180 (operation S15). The control circuit board 160 may be attached onto a surface of the lower cover 180 by an adhesive member such as a double-sided adhesive.

Next, the source circuit board 140 and the control circuit board 160 are connected using the cables 150 passing through the cable holes CH1, thereby completing the display device 10 as illustrated in FIGS. 1 through 6. Specifically, the cables 150 connected to first connectors 151a of the source circuit board 140 may be connected to second connectors 152 of the control circuit board 160 through the first cable holes CH1 penetrating the lower cover 180. This may further simplify wiring connection and ensure process economic feasibility as described above.

An exemplary embodiment of a process of manufacturing a display device will now be described. A process of manufacturing the display device 10_2 of FIG. 22 among display devices according to various embodiments will be described. Elements substantially the same as those of FIG. 22 will be indicated by the same reference numerals, and detailed reference numerals will be omitted.

Figure 27:
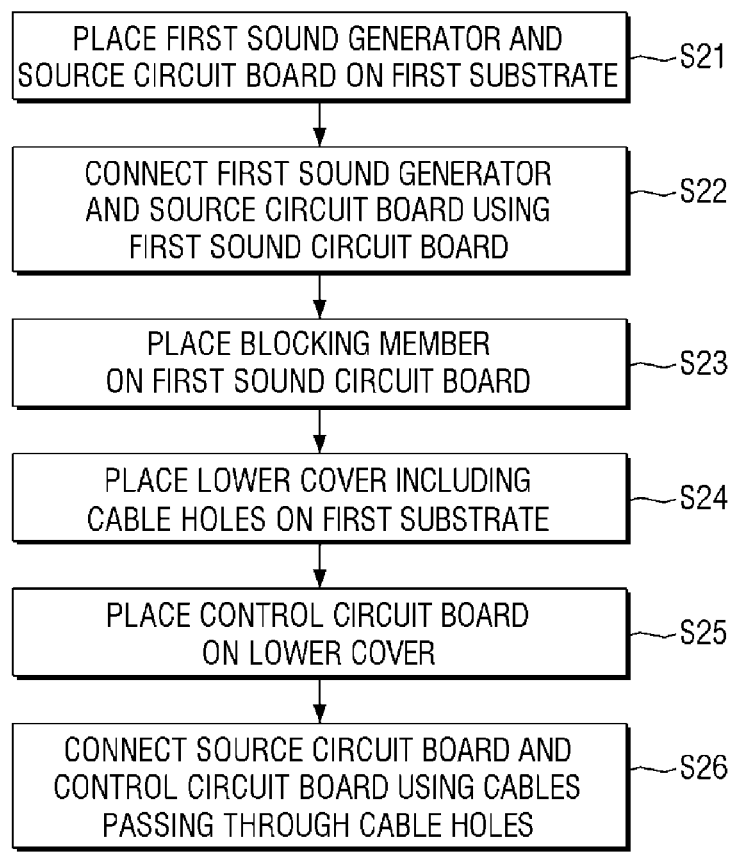
FIG. 27 is a flowchart illustrating an exemplary embodiment of a process of manufacturing a display device.

FIG. 27 is a flowchart illustrating an exemplary embodiment of a process of manufacturing the exemplary embodiment of the display device 10_2 of FIG. 22.

Referring to FIG. 27, the manufacturing process according to the illustrated exemplary embodiment is different from the manufacturing process of FIG. 26 in that a blocking member 200 is placed after a first sound generator 210 and a source circuit board 140 are connected.

The method of manufacturing a display device according to the illustrated exemplary embodiment may include placing the first sound generator 210 and the source circuit board 140 on a first substrate 111 (operation S21), connecting the first sound generator 210 and the source circuit board 140 using a first sound circuit board 250 (operation S22), placing the blocking member 200 on the first sound circuit board 250 (operation S23), placing a lower cover 180 including cable holes CH1 on the first substrate 111 (operation S24), placing a control circuit board 160 on the lower cover 180 (operation S25), and connecting the source circuit board 140 and the control circuit board 160 using cables 150 passing through the cable holes CH1 (operation S26).

Referring to FIGS. 27 and 22, first, the first sound generator 210 and the source circuit board 140 are placed on the first substrate 111 (operation S21). This operation may be substantially the same as operation S11 described above with reference to FIG. 26.

Next, the first sound generator 210 and the source circuit board 140 are connected using the first sound circuit board 250 (operation S22). This operation may be substantially the same as operation S13 described above with reference to FIG. 26.

Next, the blocking member 200 is placed on the first sound circuit board 250 (operation S23). The blocking member 200 may be attached onto a surface of the first sound circuit board 250 by an adhesive member such as a double-sided adhesive.

Next, the lower cover 180 including the cable holes CH1 is placed on the first substrate 111 (operation S24). This operation may be substantially the same as operation S14 described above with reference to FIG. 26.

Next, the control circuit board 160 is placed on the lower cover 180 (operation S25). This operation may be substantially the same as operation S15 described above with reference to FIG. 26.

Next, the source circuit board 140 and the control circuit board 160 are connected using the cables 150 passing through the cable holes CH1, thereby completing the display device 10_2 as illustrated in FIG. 22.

An exemplary embodiment of a process of manufacturing a display device will now be described. A process of manufacturing the display device 10_3 of FIGS. 22 and 23 among display devices according to various embodiments will be described. Elements substantially the same as those of FIGS. 23 and 24 will be indicated by the same reference numerals, and detailed reference numerals will be omitted.

Figure 28:
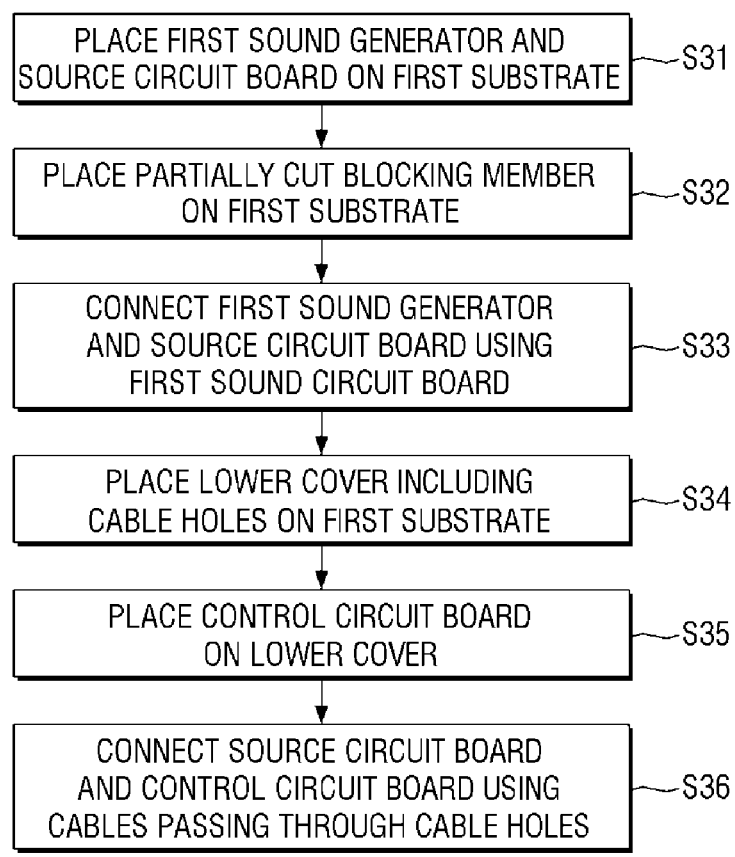
FIG. 28 is a flowchart illustrating an exemplary embodiment of a process of manufacturing a display device.

FIG. 28 is a flowchart illustrating an exemplary embodiment of a process of manufacturing the exemplary embodiment of the display device 10_3 of FIGS. 23 and 24.

Referring to FIG. 28, the manufacturing process according to the illustrated exemplary embodiment is different from the manufacturing process of FIG. 26 in that a partially cut blocking member 200 is placed on a first substrate 111.

The method of manufacturing a display device according to the illustrated exemplary embodiment may include placing a first sound generator 210 and a source circuit board 140 on the first substrate 111 (operation S31), placing the partially cut blocking member 200 on the first substrate 111 (operation S32), connecting the first sound generator 210 and the source circuit board 140 using a first sound circuit board 250 (operation S33), placing a lower cover 180 including cable holes CH1 on the first substrate 111 (operation S34), placing a control circuit board 160 on the lower cover 180 (operation S35), and connecting the source circuit board 140 and the control circuit board 160 using cables 150 passing through the cable holes CH1 (operation S36).

Referring to FIGS. 28, 23 and 24, first, the first sound generator 210 and the source circuit board 140 are placed on the first substrate 111 (operation S31). This operation may be substantially the same as operation S11 described above with reference to FIG. 26.

Next, the partially cut blocking member 200 is placed on the first substrate 111 (operation S32). The blocking member 200 may be attached onto a surface of the first substrate 111 by an adhesive member such as a double-sided adhesive.

Next, the first sound generator 210 and the source circuit board 140 are connected using the first sound circuit board 250 (operation S33). This operation may be substantially the same as operation S13 described above with reference to FIG. 26. The blocking member 200 may be partially cut in an area in which the first sound circuit board 250 is disposed. Accordingly, the first sound circuit board 250 and the blocking member 200 may not overlap each other.

In addition, in FIG. 28, the first sound generator 210 and the source circuit board 140 are connected (operation S33) after the blocking member 200 is placed (operation S32). However, the blocking member 200 may also be placed not to overlap the first sound circuit board 250 (operation S33) after the first sound generator 210 and the source circuit board 140 are connected (operation S32).

Next, the lower cover 180 including the cable holes CH1 is placed on the first substrate 111 (operation S34). This operation may be substantially the same as operation S14 described above with reference to FIG. 26.

Next, the control circuit board 160 is placed on the lower cover 180 (operation S35). This operation may be substantially the same as operation S15 described above with reference to FIG. 26.

Next, the source circuit board 140 and the control circuit board 160 are connected using the cables 150 passing through the cable holes CH1 (operation S36), thereby completing the display device 10_3 as illustrated in FIG. 24.

According to embodiments, since a sound generator disposed on a surface of a display panel uses the display panel as a diaphragm to output a sound, the sound may be output forward from a display device. Accordingly, a sound quality may be improved, and a speaker disposed on a lower surface or a side of a conventional display panel may be omitted.

In addition, the wiring connection structure of a sound generator, a source circuit board and a control circuit board is simplified to ensure process economic feasibility.

However, the effects of the exemplary embodiments are not restricted to the one set forth herein. The above and other effects of the exemplary embodiments will become more apparent to one of daily skill in the art to which the exemplary embodiments pertain by referencing the claims.

What is claimed is:

1. A display device comprising:
a display panel which comprises:
a first substrate;
a second substrate; and
a light emitting element layer which is disposed between the first substrate and the second substrate and outputs light toward the second substrate;
a first sound generator which is disposed on the first substrate and outputs a first sound by vibrating the display panel;
a source circuit board which is disposed on the first substrate;
a first sound circuit board which connects the first sound generator and the source circuit board,
a heat dissipation film disposed between the first substrate and the first sound generator, and
a blocking member disposed between the heat dissipation film and the first sound circuit board,
wherein the heat dissipation film is a metal layer or a graphite layer,
wherein a first surface of the blocking member contacts the heat dissipation film, and a second surface of the blocking member contacts the first sound circuit board.

2. The display device of claim 1, further comprising a lower cover which is disposed on the first substrate, wherein the lower cover comprises cable holes penetrating the lower cover.

3. The display device of claim 2, further comprising a circuit board which is disposed on the lower cover.

4. The display device of claim 3, further comprising a timing control circuit which is disposed on the circuit board.

5. The display device of claim 4, further comprising a sound driving circuit board which is electrically connected to the circuit board, wherein the sound driving circuit board further comprises a sound driving circuit which outputs a sound signal to the first sound generator.

6. The display device of claim 5, wherein the sound driving circuit comprises:
a digital signal processor which processes a sound control signal which is a digital signal;
a digital-to-analog converter which converts the sound control signal processed by the digital signal processor into driving voltage which are analog signal; and
an amplifier which amplifies the driving voltage output from the digital-to-analog converter and outputs an amplified driving voltage.

7. The display device of claim 3, further comprising cables which pass through the cable holes and connect the source circuit board and the circuit board.

8. A display device comprising:
a display panel which comprises:
a first substrate;
a second substrate; and
a light emitting element layer which is disposed between the first substrate and the second substrate and outputs light toward the second substrate;
a first sound generator which is disposed on the first substrate and outputs a first sound by vibrating the display panel;
a source circuit board which is disposed on the first substrate;
a first sound circuit board which connects the first sound generator and the source circuit board;
a lower cover which is disposed on the first substrate, wherein the lower cover comprises cable holes penetrating the lower cover; and a blocking member which is disposed on the first substrate,
wherein the blocking member is disposed on the first substrate and the first sound circuit board, and
wherein a first surface of the blocking member contacts a first surface of the first sound circuit board, and a second surface of the blocking member contacts the lower cover.

9. The display device of claim 1, wherein
the heat dissipation film is attached onto a surface of the first substrate, and
a second surface of the first sound circuit board contacts the heat dissipation film.

10. The display device of claim 1, wherein the first sound generator comprises:
a first electrode to which a first driving voltage is applied;
a second electrode to which a second driving voltage is applied; and
a vibration layer which is disposed between the first electrode and the second electrode and has a piezoelectric element which contracts or expands according to the first driving voltage applied to the first electrode and the second driving voltage applied to the second electrode.

11. A display device comprising:
a display panel which comprises:
a first substrate;
a second substrate; and
a light emitting element layer which is disposed between the first substrate and the second substrate and outputs light toward the second substrate;
a first sound generator which is disposed on the first substrate and outputs a first sound by vibrating the display panel;
a source circuit board which is disposed on the first substrate;
a first sound circuit board which connects the first sound generator and the source circuit board;
a lower cover which is disposed on the first substrate, wherein the lower cover comprises cable holes penetrating the lower cover; and
a blocking member which is disposed on the first substrate, wherein the first sound generator is surrounded by the blocking member, and the blocking member does not overlap the first sound circuit board in a plan view.

12. The display device of claim 2, further comprising a second sound generator which is disposed on the first substrate and outputs a second sound lower than the first sound.

13. The display device of claim 12, wherein the second sound generator comprises:
a bobbin which is disposed on a surface of the first substrate;
a voice coil which surrounds the bobbin;
a magnet which is disposed on the bobbin and spaced apart from the bobbin; and
a lower plate which is disposed on the magnet and fixed to the lower cover or the circuit board by a first fixing member.

14. The display device of claim 13, further comprising a third sound generator which is disposed on the first substrate and outputs a third sound higher than the second sound.

15. The display device of claim 14, wherein the blocking member is disposed between the first sound generator and the third sound generator, between the first sound generator and the second sound generator, and between the third sound generator and the second sound generator.

16. A display device comprising:
a display panel which comprises:
a first substrate;
an encapsulation film; and
a light emitting element layer which is disposed on the first substrate and the encapsulation film and outputs light toward the encapsulation film;
a first sound generator which is disposed on the first substrate and outputs a first sound by vibrating the display panel;
a source circuit board which is disposed on the first substrate;
a first sound circuit board which connects the first sound generator and the source circuit board,
a heat dissipation film disposed between the first substrate and the first sound generator, and
a blocking member disposed between the heat dissipation film and the first sound circuit board,
wherein the heat dissipation film is a metal layer or a graphite layer,
wherein a first surface of the blocking member contacts the heat dissipation film, and a second surface of the blocking member contacts the first sound circuit board.

* * * * *